US012580537B2

(12) United States Patent
Lehtola et al.

(10) Patent No.: US 12,580,537 B2
(45) Date of Patent: Mar. 17, 2026

(54) SATURATION DETECTION BANDWIDTH ENHANCEMENT USING VIRTUAL GROUNDS

(71) Applicant: Skyworks Solutions, Inc., Irvine, CA (US)

(72) Inventors: Philip John Lehtola, Cedar Rapids, IA (US); Lui Ray Lam, Lexington, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 437 days.

(21) Appl. No.: 18/349,446

(22) Filed: Jul. 10, 2023

(65) Prior Publication Data

US 2024/0056041 A1     Feb. 15, 2024

Related U.S. Application Data

(60) Provisional application No. 63/388,160, filed on Jul. 11, 2022.

(51) Int. Cl.
| | |
|---|---|
| *H03F 1/02* | (2006.01) |
| *H03F 3/24* | (2006.01) |
| *H03F 3/45* | (2006.01) |
| *H04B 1/04* | (2006.01) |

(52) U.S. Cl.
CPC ........... *H03F 3/245* (2013.01); *H03F 1/0288* (2013.01); *H03F 3/4508* (2013.01); *H03F 2200/451* (2013.01); *H04B 1/04* (2013.01); *H04B 2001/045* (2013.01)

(58) Field of Classification Search
CPC .................................... H03F 1/02; H03F 1/07
USPC .............................................. 330/124 R, 295
See application file for complete search history.

(56) References Cited

U.S. PATENT DOCUMENTS

| | | | |
|---|---|---|---|
| 4,743,862 A | 5/1988 | Scheinberg |
| 6,445,601 B1 | 9/2002 | Worley |
| 6,476,677 B1 | 11/2002 | Komaili et al. |
| 6,734,729 B1 | 5/2004 | Andrys et al. |
| 6,873,211 B1 | 3/2005 | Thompson et al. |
| 6,950,636 B2 | 9/2005 | Rozenblit et al. |
| 7,292,104 B1 | 11/2007 | Liwinski |
| 7,427,895 B1 | 9/2008 | Okubo et al. |
| 7,605,651 B2 | 10/2009 | Ripley et al. |
| 7,706,760 B2 | 4/2010 | Rozenblit et al. |
| 7,920,836 B2 | 4/2011 | Rozenblit et al. |
| 8,022,770 B1 | 9/2011 | Wang |

(Continued)

*Primary Examiner* — Henry Choe

(74) *Attorney, Agent, or Firm* — Knobbe, Martens, Olson & Bear, LLP

(57) ABSTRACT

The invention provides a differential power amplification stage comprising a first amplification unit adapted to amplify a first differential signal and to output an amplified first differential signal, a second amplification unit adapted to amplify a second differential signal having opposite phase to the first differential signal and to output an amplified second differential signal, and a saturation detection unit adapted to detect gain saturation of the first and second amplification unit, to generate a saturation detection signal indicating the gain saturation of first and second amplification unit, and to provide a virtual ground for the first and second differential signals for RF cancellation on the first and second differential signals. The virtual ground principle is also applied to a Doherty power amplifier module which comprises a saturation detection unit for detecting saturation in the carrier amplification stage.

20 Claims, 27 Drawing Sheets

(56) References Cited

U.S. PATENT DOCUMENTS

| | | | |
|---|---|---|---|
| 8,103,226 | B2 | 1/2012 | Andrys et al. |
| 8,188,793 | B2 | 5/2012 | Ripley et al. |
| 8,248,163 | B2 | 8/2012 | Wang |
| 8,330,546 | B2 | 12/2012 | Ripley et al. |
| 8,362,840 | B2 | 1/2013 | Andrys et al. |
| 8,432,228 | B1 | 4/2013 | Dolin |
| 8,587,380 | B2 | 11/2013 | Wang |
| 8,611,836 | B2 | 12/2013 | Ripley et al. |
| 8,666,337 | B2 | 3/2014 | Ripley et al. |
| 8,749,273 | B2 | 6/2014 | Andrys et al. |
| 8,928,356 | B2 | 1/2015 | Andrys et al. |
| 9,035,701 | B2 | 5/2015 | Schooley et al. |
| 9,041,472 | B2 | 5/2015 | Chen et al. |
| 9,214,712 | B2 | 12/2015 | Cruickshank et al. |
| 9,419,567 | B2 | 8/2016 | Ripley et al. |
| 9,515,611 | B2 | 12/2016 | Andrys et al. |
| 9,520,835 | B2 | 12/2016 | Ko et al. |
| 9,602,056 | B2 | 3/2017 | Lehtola |
| 9,621,118 | B2 | 4/2017 | Ripley et al. |
| 9,621,119 | B2 | 4/2017 | Lehtola |
| 9,654,155 | B2 | 5/2017 | Lehtola |
| 9,698,734 | B2 | 7/2017 | Lehtola et al. |
| 9,698,736 | B2 | 7/2017 | Ripley et al. |
| 9,712,125 | B2 | 7/2017 | Lehtola et al. |
| 9,722,547 | B2 | 8/2017 | Ripley et al. |
| 9,780,741 | B2 | 10/2017 | Ripley et al. |
| 9,787,260 | B2 | 10/2017 | Lehtola |
| 9,793,037 | B2 | 10/2017 | Cruickshank et al. |
| 9,806,681 | B2 | 10/2017 | Lehtola |
| 9,838,058 | B2 | 12/2017 | Pehlke et al. |
| 9,893,684 | B2 | 2/2018 | Lehtola |
| 9,893,687 | B2 | 2/2018 | Lehtola |
| 9,899,961 | B2 | 2/2018 | Lehtola et al. |
| 9,923,523 | B2 | 3/2018 | Lehtola |
| 9,935,594 | B2 | 4/2018 | Lehtola |
| 9,979,349 | B2 | 5/2018 | Lehtola |
| 9,991,850 | B2 | 6/2018 | Lehtola |
| 10,644,374 | B1 | 5/2020 | Lee et al. |
| 11,916,517 | B2 | 2/2024 | Lehtola |
| 2007/0008038 | A1 | 1/2007 | Klepser et al. |
| 2007/0264947 | A1 | 11/2007 | Rozenblit et al. |
| 2012/0286866 | A1 | 11/2012 | Khanifar et al. |
| 2015/0155843 | A1 | 6/2015 | Scott et al. |
| 2015/0326181 | A1 | 11/2015 | Chen et al. |
| 2015/0326183 | A1 | 11/2015 | Chen et al. |
| 2015/0349741 | A1 | 12/2015 | Lehtola et al. |
| 2016/0093948 | A1 | 3/2016 | Lehtola |
| 2016/0241205 | A1 | 8/2016 | Lehtola |
| 2016/0241206 | A1 | 8/2016 | Lehtola |
| 2016/0241207 | A1 | 8/2016 | Lehtola |
| 2016/0242057 | A1 | 8/2016 | Ripley et al. |
| 2017/0019076 | A1 | 1/2017 | Ripley et al. |
| 2017/0141734 | A1 | 5/2017 | Lehtola |
| 2017/0155383 | A1 | 6/2017 | Andrys et al. |
| 2017/0250727 | A1 | 8/2017 | Lehtola |
| 2017/0302230 | A1 | 10/2017 | Lehtola et al. |
| 2017/0302231 | A1 | 10/2017 | Ripley et al. |
| 2017/0317653 | A1 | 11/2017 | Lehtola et al. |
| 2017/0366168 | A1 | 12/2017 | Roberg et al. |
| 2018/0097483 | A1 | 4/2018 | Lehtola |
| 2018/0130585 | A1 | 5/2018 | Cruickshank et al. |
| 2018/0159577 | A1 | 6/2018 | Pehlke et al. |
| 2018/0183389 | A1 | 6/2018 | Lehtola et al. |
| 2018/0241360 | A1 | 8/2018 | Lehtola |
| 2019/0097582 | A1 | 3/2019 | Lehtola |
| 2019/0097585 | A1 | 3/2019 | Lehtola |
| 2019/0140591 | A1 | 5/2019 | Lehtola |
| 2019/0149099 | A1 | 5/2019 | Lehtola |
| 2019/0158045 | A1 | 5/2019 | Zampardi, Jr. et al. |
| 2019/0158046 | A1 | 5/2019 | Lehtola et al. |
| 2019/0165738 | A1 | 5/2019 | Pan et al. |
| 2019/0165739 | A1 | 5/2019 | Lyalin et al. |
| 2019/0214945 | A1 | 7/2019 | Lehtola |
| 2019/0229688 | A1 | 7/2019 | Lehtola |
| 2019/0260367 | A1 | 8/2019 | Andrys et al. |
| 2019/0305728 | A1 | 10/2019 | Lehtola |
| 2019/0326864 | A1 | 10/2019 | Lehtola |
| 2020/0014338 | A1 | 1/2020 | Datta et al. |
| 2020/0028472 | A1 | 1/2020 | Scott et al. |
| 2020/0044609 | A1 | 2/2020 | Lehtola |
| 2020/0091870 | A1 | 3/2020 | Lehtola et al. |
| 2020/0099346 | A1 | 3/2020 | Lehtola et al. |
| 2020/0106405 | A1 | 4/2020 | Lehtola |
| 2020/0162032 | A1 | 5/2020 | Ripley et al. |
| 2020/0162039 | A1 | 5/2020 | Lehtola et al. |
| 2020/0336113 | A1 | 10/2020 | Pan et al. |
| 2021/0036661 | A1 | 2/2021 | Lehtola |
| 2024/0154573 | A1 | 5/2024 | Lehtola |

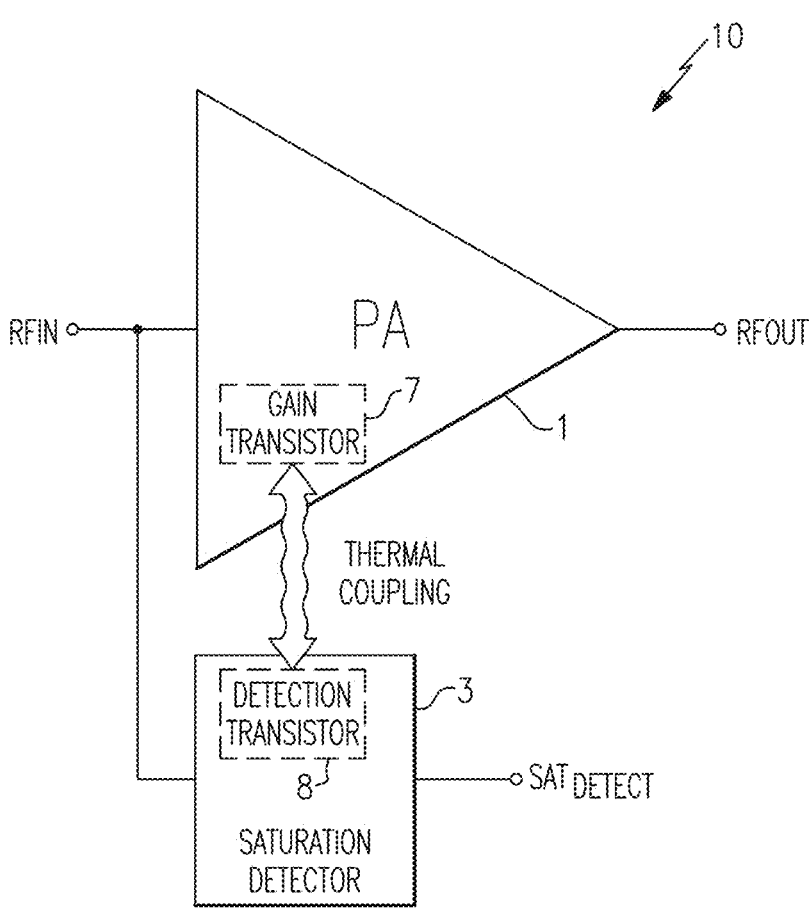
<u>FIG.1</u>

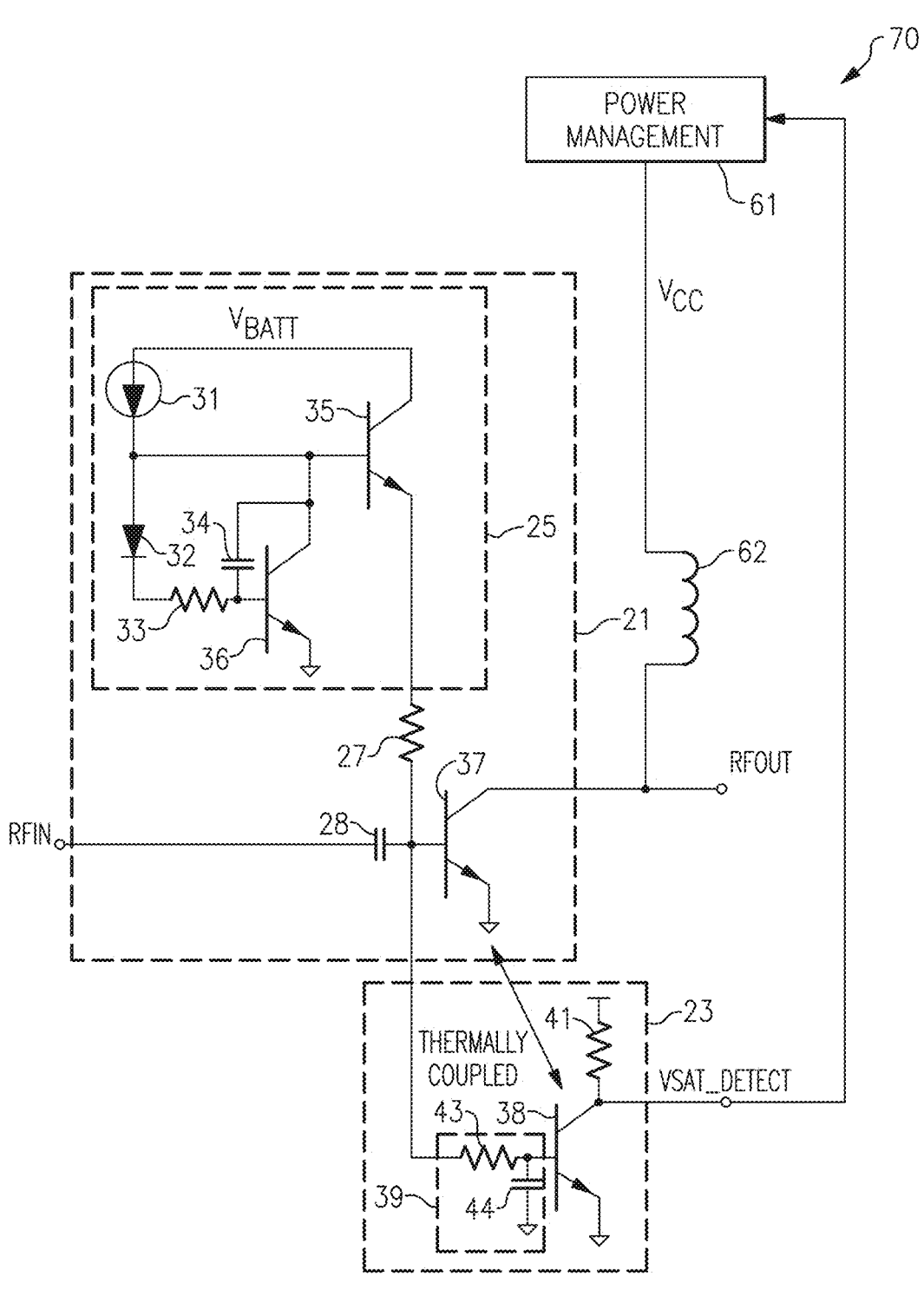
<u>FIG.3</u>

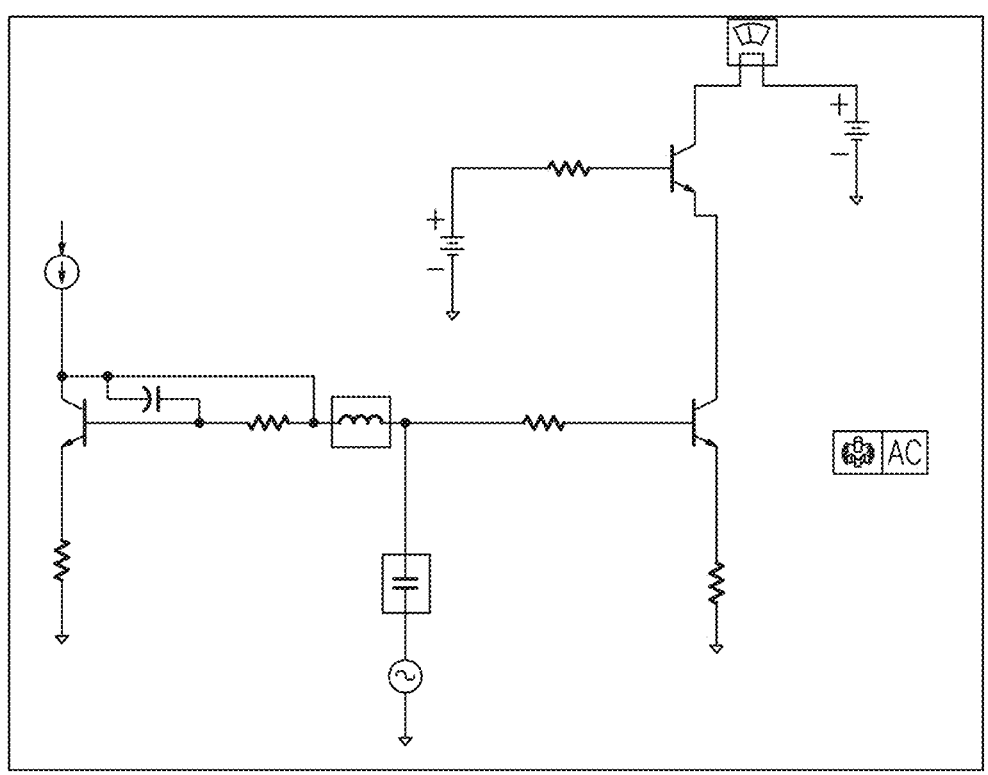
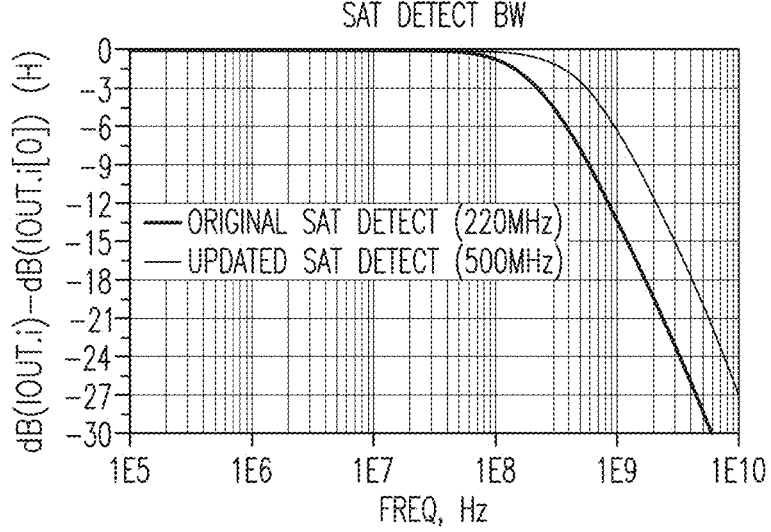
FIG.8

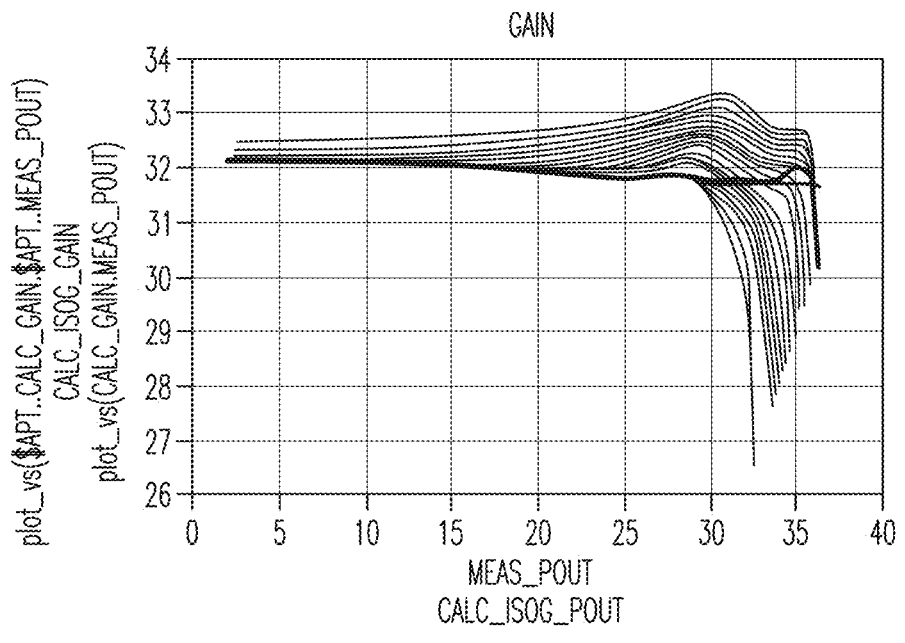
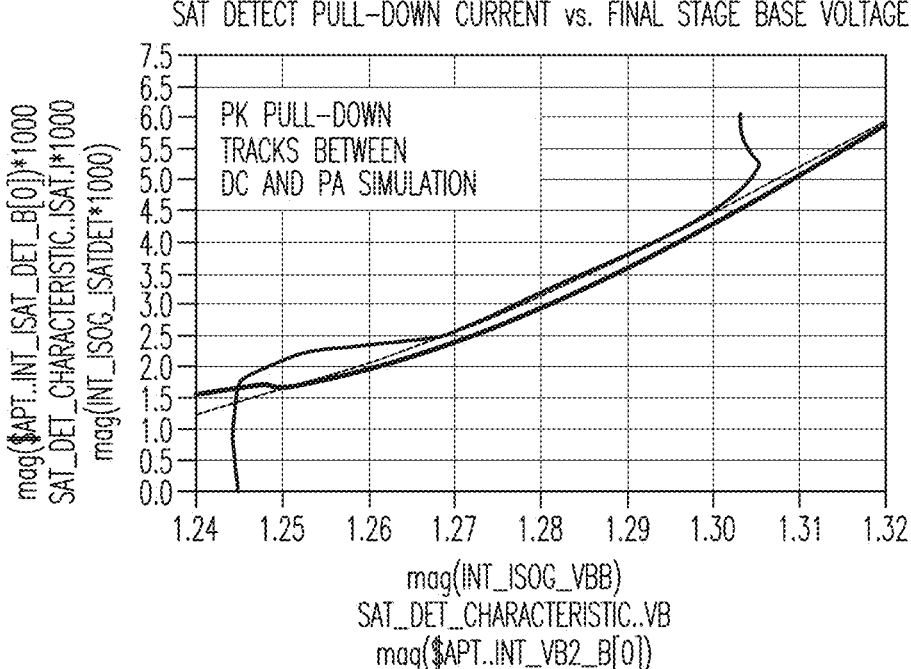
FIG.9A

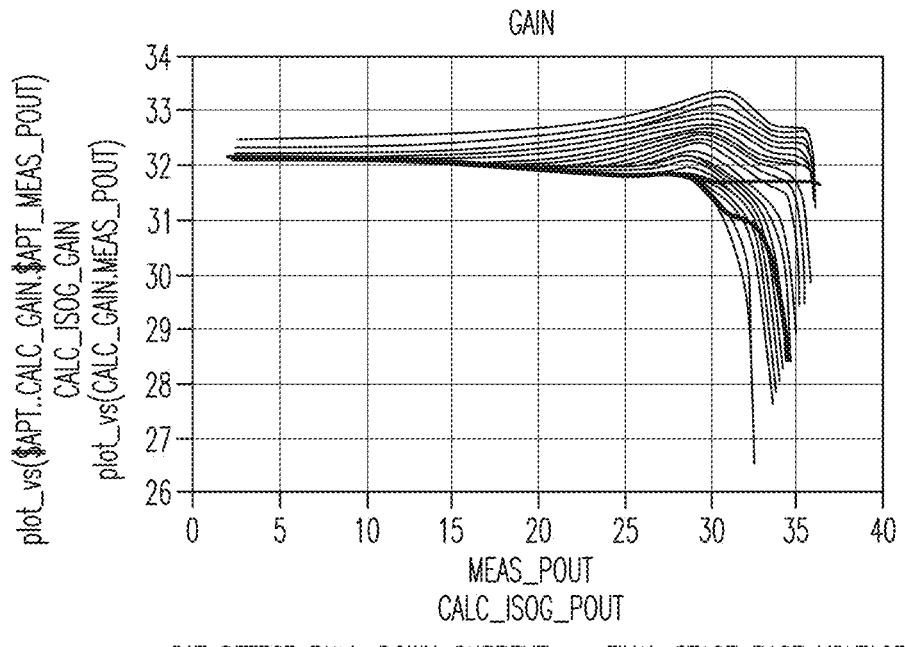
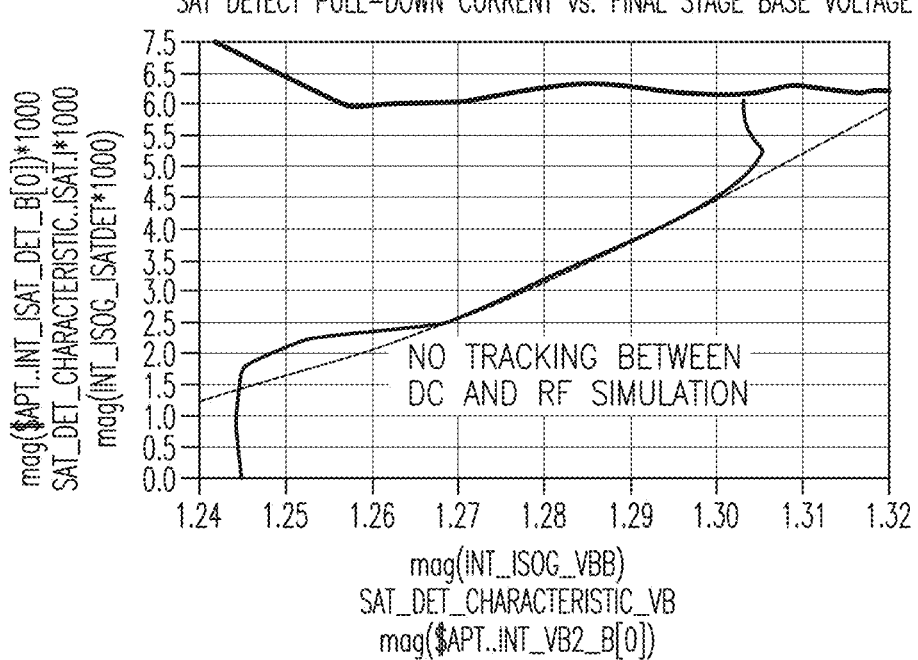
FIG.9B

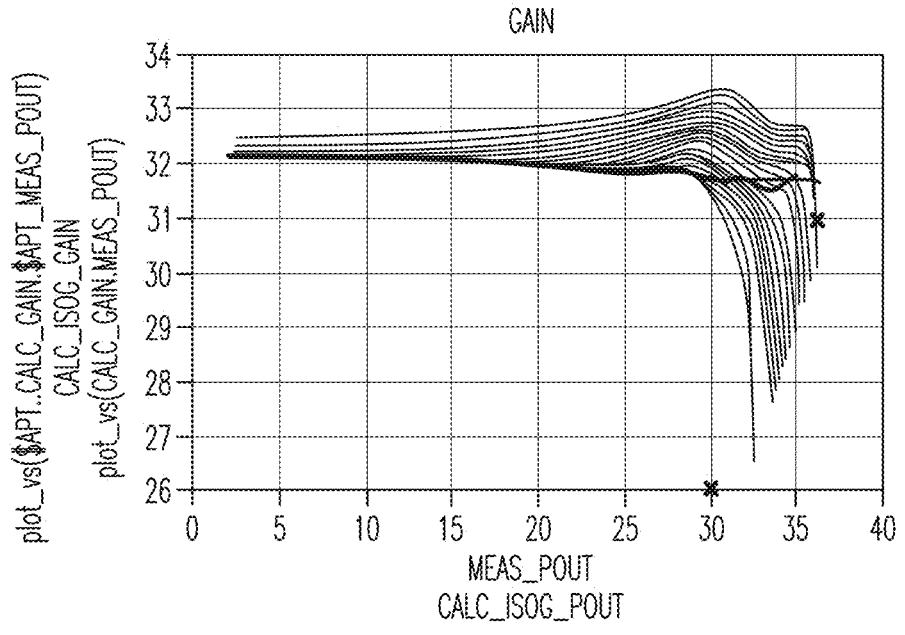
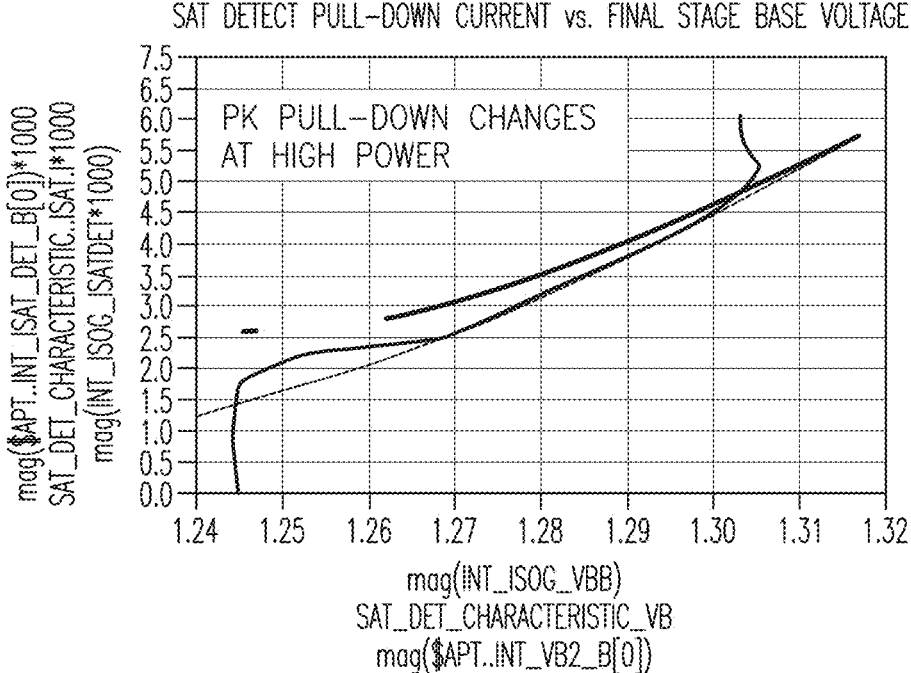
FIG.9C

GAIN
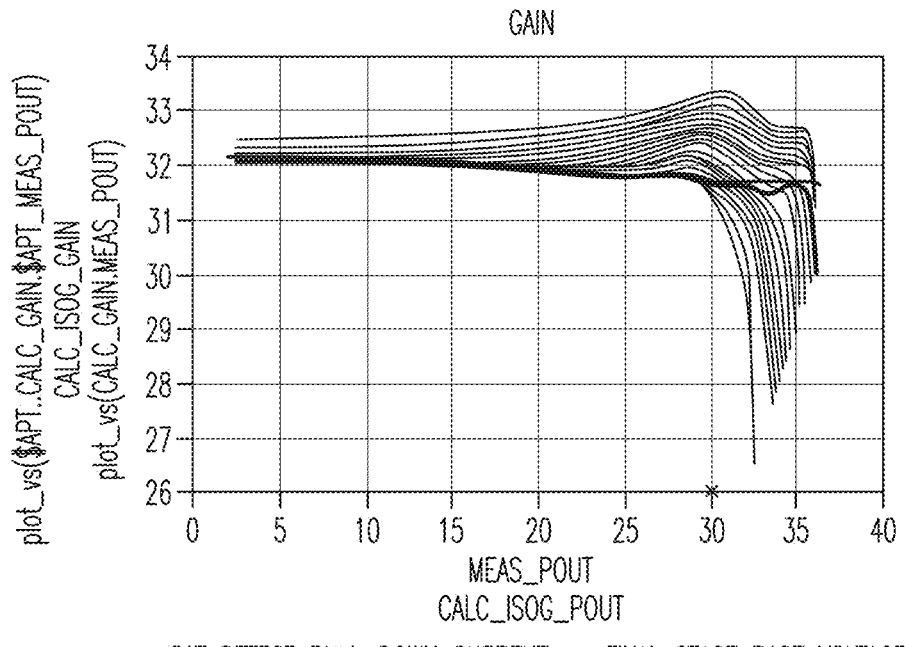
SAT DETECT PULL-DOWN CURRENT vs. FINAL STAGE BASE VOLTAGE
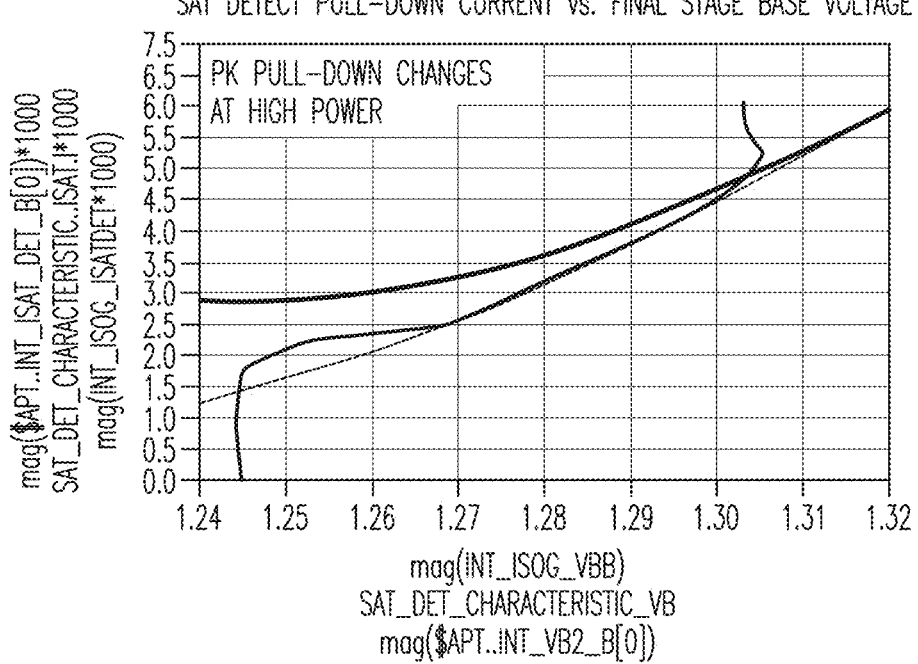
FIG.9D

SATURATION DETECTION BANDWIDTH ENHANCEMENT USING VIRTUAL GROUNDS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

Embodiments of the invention relate to electronic systems, and in particular to power amplifiers for electronic devices used in radio frequency (RF) communication systems.

Description of the Related Technology

Power amplifiers (PAs) are used in RF communication systems to amplify RF input signals for transmission via antennas.

Examples of RF communication systems in which such power amplifiers are used include, but are not limited to, mobile phones, tablets, base stations, network access points, laptops, and wearable electronics. Power amplifiers provide amplification to RF signals, which can have a frequency in the range from about 30 kHz to 300 GHz, for instance, in the range of about 410 MHz to about 7.125 GHz for Fifth Generation (5G) cellular communications in Frequency Range 1 (FR1). Generally, it is important to manage the power of RF signal transmissions to prolong battery life and/or to provide suitable transmit power levels. amplification. An RF signal can have a frequency in the range of about 30 kHz to 300 GHz, such as in the range of about 410 MHz to about 7.125 GHz for fifth generation (5G) communications using Frequency Range 1 (FR1) or in the range of about 24.25 GHz to 52.6 GHz for 5G communications using Frequency Range 2 (FR2).

Generally, the linearity of a power amplifier (PA) is directly related to the level of gain compression within the amplifier. Often, the power amplifier is designed for a fixed supply voltage which defines the target load impedance for acceptable linearity. When the power amplifier is used, for example, in a mobile handset, there is a significant variation of the load which is presented to the PA device. As a result, the power amplifier linearity degrades in a mobile application causing degraded spectral performance. Hence, there is a need for monitoring amplifier compression and for dynamically eliminating the degraded performance.

Power amplifiers can typically comprise a gain transistor which amplifies a single-ended input signal into a single-ended output signal. The power amplifier can also comprise several stages of the gain transistors or can be realized as differential amplifier for amplifying differential signals.

An advantageous design of a power amplifier is the so-called Doherty power amplifier which comprises a carrier power amplifier as well as a peaking power amplifier driven by the carrier power amplifier. When the gain of the carrier power amplifier saturates at high input signal levels, the peaking power amplifier takes over and provides additional gain. Saturation detection circuits are available to detect the carrier power amplifier going into saturation.

However, the Doherty power amplifier has poor performance into load voltage standing wave ratio (VSWR) because the AM/AM distortion (the AM/AM distortion is the difference between the supply voltage and the envelope of the RF output voltage; such a difference is caused by a nonlinear relationship between the supply voltage and the envelope of the RF output signal) of the carrier power amplifier is a function of the load and the AM/AM of the peaking power amplifier is a function of input power. These are uncorrelated parameters. Severe non-linearity occurs even with low VSWR when the compression characteristic of the carrier power amplifier is in sync with the turn-on characteristic of the peaking amplifier. This also results in a small bandwidth of the saturation detection. Hence, there is also a need for a saturation detection bandwidth enhancement in the Doherty power amplifier.

Irrespective of whether the Doherty power amplifier operates on single-ended signals or differential signals (when the carrier power amplifier as well as the peaking power amplifier are realized as differential amplifiers), the saturation detection circuits must also be isolated from RF corruption. Conventional solutions use large isolation resistors and bypass capacitors. These resistors and capacitors form an RC network that limits the video (that is modulation) bandwidth of the network. This results also in degraded linearity or ACLR (Adjacent Channel Leakage Ratio) with wider bandwidth modulations. This is a particular problem for New Radio (NR) 5G signals in mobile communications applications.

The provision of high gain power amplifiers with sufficient bandwidth is especially relevant in power amplifier modules which need to support both APT (average power tracking) and ET (envelope tracking) operations. Achieving sufficient gain in ET mode of operation is an added challenge, since envelope tracking requires a high gain power amplifier to operate in a gain compressed region, further limiting the available large signal power gain from the power amplifier module. Thus, there is also a need and high demand for a power amplifier system and power amplifier which can achieve the desired high gain with a saturation detection bandwidth enhancement and high linearity required e. g. in a wide-band 100 MHz modulation bandwidth particularly in ET mode of operation at 5G-NR Tx frequencies.

SUMMARY

In certain embodiments of this disclosure, this disclosure relates to a differential power amplification stage comprising a first amplification unit adapted to amplify a first differential signal and to output an amplified first differential signal, a second amplification unit adapted to amplify a second differential signal having opposite phase to the first differential signal and to output an amplified second differential signal; and a saturation detection unit adapted to detect gain saturation of the first and second amplification unit, to generate a saturation detection signal indicating the gain saturation of first and second amplification unit, and to provide a virtual ground for the first and second differential signals for RF cancellation on the first and second differential signals.

In other embodiments of this disclosure, the differential power amplifier stage includes an input signal converter including an input configured to receive a single-ended radio frequency, RF, input signal and to convert same into the first and second differential signal having opposite phase to each other, and an output signal combiner adapted to combine the first and second amplified differential signals into an amplified single-ended output signal.

In other embodiments of this disclosure, the first and second amplification units each comprise a bipolar gain transistor.

In other embodiments of this disclosure, the saturation detection unit comprises a first bipolar detection transistor having a base thereof connected to a base of the gain transistor of the first amplification unit, having an emitter thereof connected to ground via a first resistor, and being thermally coupled to the gain transistor of the first amplification unit, and a second bipolar detection transistor having a base thereof connected to a base of the gain transistor of the second amplification unit, having an emitter thereof connected to ground via a second resistor, and being thermally coupled to the gain transistor of the second amplification unit.

In other embodiments of this disclosure, collectors of the first and second bipolar detection transistors are connected to a power supply voltage though a third resistor, the bases of the first and second bipolar detection transistors are connected together to establish a virtual ground at the bases, and the emitters of the first and second detection bipolar transistors are connected together to establish a virtual ground at the emitters.

In other embodiments of this disclosure, the connected collectors are configured to output the saturation detection signal indicating a gain saturation of the gain transistors of the first and second amplifier unit.

In other embodiments of this disclosure, the input signal converter comprises a transformer having a primary winding and a secondary winding, a first terminal of the primary winding receiving the single-ended RF input signal and a second terminal of the primary winding being connected to ground, and a first terminal of the secondary winding outputting the first differential signal and a second terminal of the secondary winding outputting the second differential signal.

In other embodiments of this disclosure, the output signal combiner comprises a transformer having a primary winding and a secondary winding, a first terminal of the primary winding receiving the first amplified differential signal and a second terminal of the primary winding receiving the second amplified differential signal, and a first terminal of the secondary winding outputting a single-ended amplified RF output signal and a second terminal of the secondary winding being connected to ground.

In certain embodiments of this disclosure, this disclosure also relates to a Doherty power amplifier comprising a first differential amplification stage constituting a differential carrier amplification stage of the Doherty power amplifier, a second differential amplification stage constituting a differential peaking amplification stage of the Doherty power amplifier, and a saturation detection unit adapted to detect gain saturation of the differential carrier amplification stage, to drive the differential peaking amplification stage based on the detected gain saturation of the differential carrier amplification stage, and to provide a virtual ground for differential signals of the differential carrier amplification stage for RF cancellation on the differential signals.

In other embodiments of this disclosure, the differential carrier amplification stage includes a first and second amplification unit adapted to amplify a first and a second differential signal having opposite phases and corresponding to a first RF single-ended input signal, and the differential peaking amplification stage includes a third and fourth amplification unit adapted to amplify a third and a fourth differential signal having opposite phases and corresponding to a second RF single-ended input signal.

In other embodiments of this disclosure, there is also disclosed an input splitter adapted to receive the single ended RF input signal and to split the single ended input signal into the first and second RF single-ended input signals having opposite phases, and an output converter adapted to convert amplified differential output signals output from the first to fourth amplification units into an amplified output single-ended signal.

In other embodiments of this disclosure, the first to fourth amplification units each comprise a bipolar gain transistor.

In other embodiments of this disclosure, the saturation detection unit comprises a first bipolar detection transistor having a base thereof connected to a base of the gain transistor of the first amplification unit of the carrier amplification stage, having an emitter thereof connected to ground via a first resistor, and being thermally coupled to the gain transistor of the first amplification unit of the carrier amplification stage, and a second bipolar detection transistor having a base thereof connected to a base of the gain transistor of the second amplification unit of the carrier amplification stage, having an emitter thereof connected to ground via a second resistor, and being thermally coupled to the gain transistor of the second amplification unit.

In other embodiments of this disclosure, the collector of the first bipolar detection transistor is connected to the base of the gain transistor of the third amplification unit of the peaking amplification stage, and the collector of the second bipolar detection transistor is connected to the base of the gain transistor of the fourth amplification unit of the peaking amplification stage.

In other embodiments of this disclosure, the bases of the first and second bipolar detection transistors are connected together to establish a virtual ground at the bases, and the emitters of the first and second detection bipolar transistors are connected together to establish a virtual ground at the emitters.

In other embodiments of this disclosure, the carrier amplification stage includes a first input signal converter including an input configured to receive the first single-ended radio frequency, RF, input signal and to convert same into the first and second differential signals having opposite phase to each other.

In other embodiments of this disclosure, the peaking amplification stage includes a second input signal converter including an input configured to receive the first single-ended radio frequency, RF, input signal and to convert same into the first and second differential signals having opposite phase to each other.

In other embodiments of this disclosure, the output converter comprises a transformer having a primary winding having a first and second terminal and a secondary winding having a first and second terminal.

In other embodiments of this disclosure, the output converter further comprises a first coupling capacitor connected between the collectors of gain transistors of the third and fourth amplification units of the peaking amplification stage, and a second coupling capacitor connected between the collectors of gain transistors of the first and second amplification units of the carrier amplification stage.

In other embodiments of this disclosure, the first terminal of the primary winding receives a third amplified differential signal from the third amplification unit of the peaking amplification stage and a first amplified differential signal from the first amplification unit of the carrier amplification stage through a first coupling resistor.

In other embodiments of this disclosure, the second terminal of the primary winding receiving a fourth amplified differential signal from the fourth amplification unit of the peaking amplification stage and a second amplified differential signal from the second amplification unit of the carrier amplification stage through a second coupling resistor.

In other embodiments of this disclosure, the first terminal of the secondary winding is adapted to output the amplified output single-ended signal and the second terminal of the secondary winding is connected to ground.

In other embodiments of this disclosure, the input splitter comprises a transformer having a primary winding and a secondary winding, a first terminal of the primary winding receiving the single-ended RF input signal, a second terminal of the primary winding outputting the first single-ended RF input signal, a first terminal of the secondary winding outputting the single-ended second RF input signal and a second terminal of the secondary winding being connected to ground via a resistor.

In other embodiments of this disclosure, the first terminals of the primary and second windings are connected via a first capacitor, and the second terminals of the primary and second windings are connected via a second capacitor.

In other embodiments of this disclosure, the saturation detection unit is operable to turn on the peaking amplification stage in response to the saturation detection unit detecting that the carrier amplification stage is saturated.

In other embodiments of this disclosure, the saturation detection unit is operable to adjust a bias of the peaking amplification stage.

In other embodiments of this disclosure, the saturation detection unit is operable to adjust a voltage level of a power supply voltage of the Doherty power amplifier.

In other embodiments of this disclosure, there is also provided a power management system configured to increase the voltage level of the power supply voltage in response to the saturation detection unit indicating that the carrier amplification stage has saturated.

In other embodiments of this disclosure, the detection transistors and respective gain transistors are located within about 20 um.

In other embodiments of this disclosure, the gain transistors and the detection transistors are NPN bipolar transistors.

In certain embodiments, this disclosure also relates to a mobile device comprising a transceiver configured to generate a single-ended radio frequency, RF, input signal, and a front end system including a Doherty power amplifier configured to receive the single-ended RF input signal at an input and configured to amplify the single ended RF input signal into an amplified single-ended RF output signal, the Doherty power amplifier comprising an input splitter adapted to receive the single ended RF input signal and to split the single ended RF input signal into a first and second RF single-ended input signal having opposite phases, an output converter, a first differential amplification stage constituting a differential carrier amplification stage of the Doherty power, a second differential amplification stage constituting a differential peaking amplification stage of the Doherty power amplifier, and a saturation detection unit, the differential carrier amplification stage having a first and second amplification unit adapted to amplify a first and second differential signal having opposite phases and corresponding to a single-ended first input signal, the differential peaking amplification stage having a third and fourth amplification unit adapted to amplify a third and fourth differential signal having opposite phases and corresponding to a single-ended second input signal, the single-ended second input signal having opposite phase to the single-ended first input signal, the saturation detection unit adapted to detect gain saturation of the differential carrier amplification stage and to drive the differential peaking amplification stage based on the detected gain saturation of the differential carrier amplification stage, the saturation detection unit being further adapted to provide a virtual ground for the first to fourth differential signals for RF noise cancellation on the first to fourth differential signals, and the output converter adapted to convert amplified differential output signals output from the first to fourth amplification units into the single-ended amplified output signal.

In other embodiments of this disclosure, the first to fourth amplification units each comprise a bipolar gain transistor.

In other embodiments of this disclosure, the saturation detection unit comprises a first bipolar detection transistor having a base thereof connected to a base of the gain transistor of the first amplification unit of the carrier amplification stage, having an emitter thereof connected to ground via a first resistor, and being thermally coupled to the gain transistor of the first amplification unit of the carrier amplification stage, and a second bipolar detection transistor having a base thereof connected to a base of the gain transistor of the second amplification unit of the carrier amplification stage, having an emitter thereof connected to ground via a second resistor, and being thermally coupled to the gain transistor of the second amplification unit, the collector of the first bipolar detection transistor being connected to the base of the gain transistor of the third amplification unit of the peaking amplification stage, the collector of the second bipolar detection transistor being connected to the base of the gain transistor of the fourth amplification unit of the peaking amplification stage, the bases of the first and second bipolar detection transistors being connected together to establish a virtual ground at the bases, and the emitters of the first and second detection bipolar transistors being connected together to establish a virtual ground at the emitters.

In certain embodiments, this disclosure also relates to a mobile device comprising a transceiver configured to generate a single-ended radio frequency, RF, input signal, a power management system including an envelope tracker configured to generate a power amplifier supply voltage that changes in relation to an envelope of the radio frequency signal, and a power amplifier module including a power amplifier configured to amplify the single-ended radio frequency, RF, input signal into an amplified single-ended output RF signal, and to receive power from the power amplifier supply voltage, the power amplifier including a Doherty power amplifier, the Doherty power amplifier comprising an input splitter adapted to receive the single ended RF input signal and to split the single ended RF input signal into a first and second RF single-ended input signal having opposite phases, an output converter, a first differential amplification stage constituting a differential carrier amplification stage of the Doherty power, a second differential amplification stage constituting a differential peaking amplification stage of the Doherty power amplifier, and a saturation detection unit, the differential carrier amplification stage having a first and second amplification unit adapted to amplify a first and second differential signal having opposite phases and corresponding to a single-ended first input signal, the differential peaking amplification stage having a third and fourth amplification unit adapted to amplify a third and fourth differential signal having opposite phases and corresponding to a single-ended second input signal, the single-ended second input signal having opposite phase to the single-ended first input signal, the saturation detection unit adapted to detect gain saturation of the differential carrier amplification stage and to drive the differential peaking amplification stage based on the detected gain saturation of the differential carrier amplification stage, the saturation detection unit being further adapted to provide a virtual ground for the first to fourth differential signals for RF noise cancellation on the first to fourth differential signals, and the output converter adapted to convert amplified differential output signals output from the first to fourth amplification units into the single-ended amplified RF output signal.

In other embodiments of this disclosure, the envelope tracker includes a DC-to-DC converter and an error amplifier configured to operate in parallel with one another to generate the power amplifier supply voltage.

In other embodiments of this disclosure, the error amplifier is included on the power amplifier module, and the DC-to-DC converter is external to the power amplifier module.

In other embodiments of this disclosure, the first to fourth amplification units each comprise a bipolar gain transistor.

In other embodiments of this disclosure, the saturation detection unit comprises a first bipolar detection transistor having a base thereof connected to a base of the gain transistor of the first amplification unit of the carrier amplification stage, having an emitter thereof connected to ground via a first resistor, and being thermally coupled to the gain transistor of the first amplification unit of the carrier amplification stage, and a second bipolar detection transistor having a base thereof connected to a base of the gain transistor of the second amplification unit of the carrier amplification stage, having an emitter thereof connected to ground via a second resistor, and being thermally coupled to the gain transistor of the second amplification unit, the collector of the first bipolar detection transistor being connected to the base of the gain transistor of the third amplification unit of the peaking amplification stage, the collector of the second bipolar detection transistor being connected to the base of the gain transistor of the fourth amplification unit of the peaking amplification stage, the bases of the first and second bipolar detection transistors being connected together to establish a virtual ground at the bases, and the emitters of the first and second detection bipolar transistors being connected together to establish a virtual ground at the emitters.

According to certain still other embodiments, this disclosure relates to an envelope tracking system comprising an envelope tracker configured to generate a power amplifier supply voltage that changes is relation to an envelope of a single-ended radio frequency, RF, input signal, and a power amplifier module including a power amplifier configured to amplify the single-ended RF input signal into an amplified RF output signal, and to receive power from the power amplifier supply voltage, the power amplifier module including a Doherty power amplifier, the Doherty power amplifier comprising an input splitter adapted to receive the single ended RF input signal and to split the single ended RF input signal into a first and second RF single-ended input signal having opposite phases, an output converter, a first differential amplification stage constituting a differential carrier amplification stage of the Doherty power, a second differential amplification stage constituting a differential peaking amplification stage of the Doherty power amplifier, and a saturation detection unit, the differential carrier amplification stage having a first and second amplification unit adapted to amplify a first and second differential signal having opposite phases and corresponding to a single-ended first input signal, the differential peaking amplification stage having a third and fourth amplification unit adapted to amplify a third and fourth differential signal having opposite phases and corresponding to a single-ended second input signal, the single-ended second input signal having opposite phase to the single-ended first input signal, the saturation detection unit adapted to detect gain saturation of the differential carrier amplification stage and to drive the differential peaking amplification stage based on the detected gain saturation of the differential carrier amplification stage, the saturation detection unit being further adapted to provide a virtual ground for the first to fourth differential signals for RF noise cancellation on the first to fourth differential signals, and the output converter adapted to convert amplified differential output signals output from the first to fourth amplification units into the single-ended amplified RF output signal.

In other embodiments of this disclosure, the first to fourth amplification units each comprise a bipolar gain transistor.

In other embodiments of this disclosure, the saturation detection unit comprises a first bipolar detection transistor having a base thereof connected to a base of the gain transistor of the first amplification unit of the carrier amplification stage, having an emitter thereof connected to ground via a first resistor, and being thermally coupled to the gain transistor of the first amplification unit of the carrier amplification stage; and a second bipolar detection transistor having a base thereof connected to a base of the gain transistor of the second amplification unit of the carrier amplification stage, having an emitter thereof connected to ground via a second resistor, and being thermally coupled to the gain transistor of the second amplification unit, the collector of the first bipolar detection transistor being connected to the base of the gain transistor of the third amplification unit of the peaking amplification stage, the collector of the second bipolar detection transistor being connected to the base of the gain transistor of the fourth amplification unit of the peaking amplification stage, the bases of the first and second bipolar detection transistors being connected together to establish a virtual ground at the bases, and the emitters of the first and second detection bipolar transistors being connected together to establish a virtual ground at the emitters.

In certain other embodiments of this disclosure, this disclosure also relates to a packaged module comprising a die, surface mount components, wirebonds, a package substrate, and an encapsulation structure, the package substrate including pads formed from conductors disposed therein, the die further including pads, the wirebonds electrically connecting the pads of the die to the pads of the package substrate, and the die including a Doherty power amplifier comprising an input splitter adapted to receive a single ended RF input signal and to split the single ended RF input signal into a first and second RF single-ended input signal having opposite phases, an output converter, a first differential amplification stage constituting a differential carrier amplification stage of the Doherty power, a second differential amplification stage constituting a differential peaking amplification stage of the Doherty power amplifier, and a saturation detection unit, the differential carrier amplification stage having a first and second amplification unit adapted to amplify a first and second differential signal having opposite phases and corresponding to a single-ended first input signal, the differential peaking amplification stage having a third and fourth amplification unit adapted to amplify a third and fourth differential signal having opposite phases and corresponding to a single-ended second input signal, the single-ended second input signal having opposite phase to the single-ended first input signal, the saturation detection unit adapted to detect gain saturation of the differential carrier amplification stage and to drive the differential peaking amplification stage based on the detected gain saturation of the differential carrier amplification stage, the saturation detection unit being further adapted to provide a virtual ground for the first to fourth differential signals for RF noise cancellation on the first to fourth differential signals, and the output converter adapted to convert amplified differential output signals output from the first to fourth amplification units into a single-ended amplified RF output signal.

In certain other embodiments, this disclosure also relates to a phone board, comprising the packaged module as described above.

The disclosure is, however, not limited to the above-described embodiments and may comprise embodiments which result from any combination of one or more of the above embodiments.

BRIEF DESCRIPTION OF THE DRAWINGS

Embodiments of this disclosure will now be described, by way of non-limiting example, with reference to the accompanying drawings.

FIG. 1 is a schematic diagram of one embodiment of a power amplifier system with saturation detection.

FIG. 3 is a schematic diagram of another embodiment of a power amplifier system with saturation detection.

FIG. 8 shows results of the saturation detection bandwidth improvement of the Doherty power amplifier of FIG. 7E.

FIGS. 9A-9D shows RF corruption aspects in a Doherty power amplifier.

DETAILED DESCRIPTION OF CERTAIN EMBODIMENTS

Figure 2A:
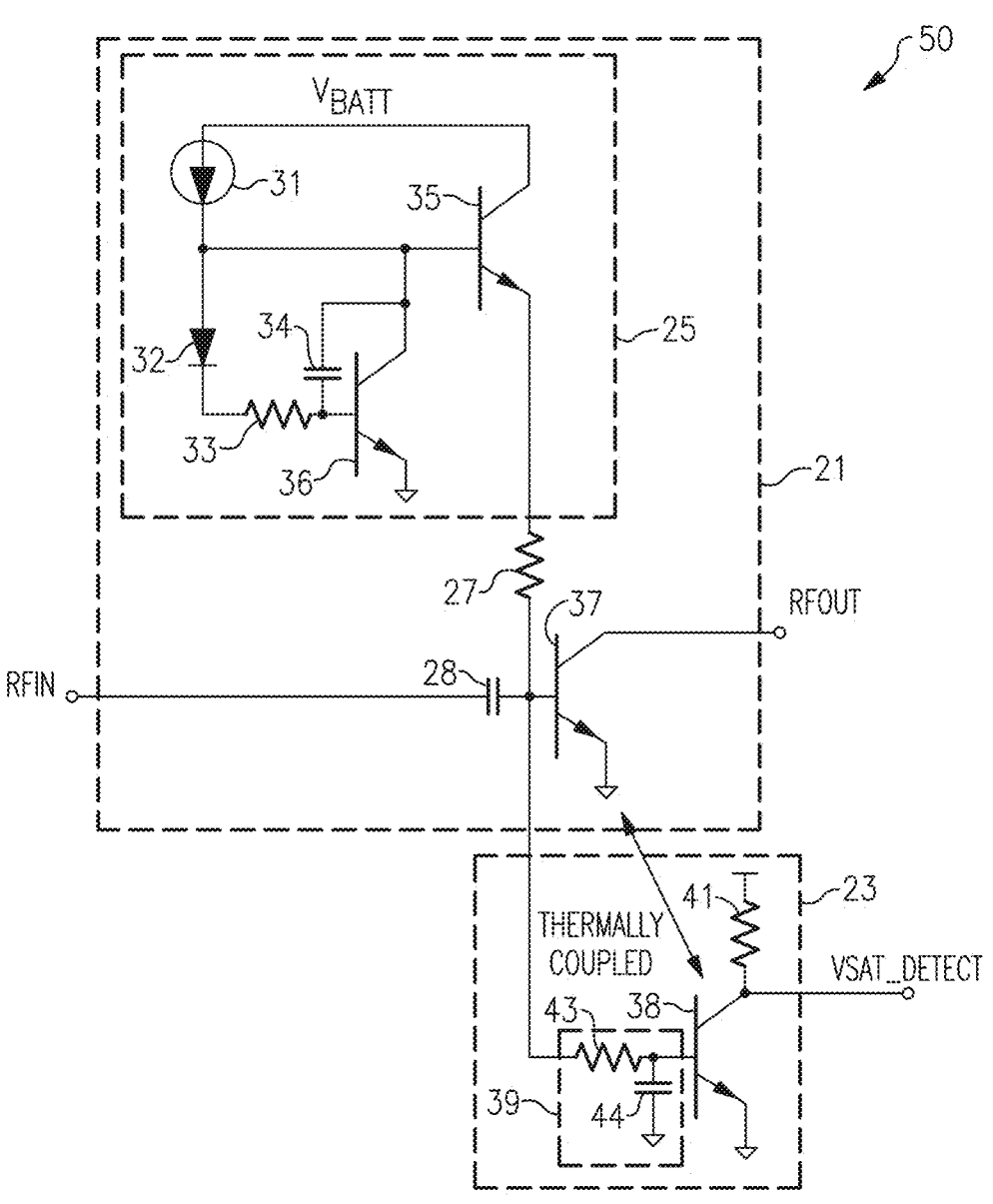
FIG. 2A is a schematic diagram of another embodiment of a power amplifier system with saturation detection.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the Figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. Hereinafter, electronic devices used in RF (radio frequency) communication systems are described in which power amplifiers according to the invention are typically used.

As already mentioned above, the linearity of a power amplifier is directly related to a level of gain compression within the power amplifier. Thus, a power amplifier can be designed for a fixed supply voltage that defines the target load impedance for acceptable linearity.

In certain applications, such as mobile handsets, operating environment leads to a relatively large variation in the load presented to a power amplifier. For example, a voltage standing wave ratio (VSWR) of an antenna and thus the power amplifier's load can vary based on a user's handling of the mobile handset. The load variation degrades power amplifier linearity and/or spectral performance.

As explained above, one type of power amplifier is a Doherty power amplifier, which includes a main or carrier amplification stage and an auxiliary or peaking amplification stage that operate in combination with one another to amplify an RF input signal. The Doherty power amplifier combines a carrier signal from the carrier amplification stage and a peaking signal from the peaking stage to generate an amplified RF output signal. In certain implementations, the carrier amplification stage is enabled over a wide range of power levels while the peaking amplification stage is selectively enabled (for instance, by a class C bias circuit) at high power levels.

Such Doherty power amplifiers operate with high efficiency at 6 dB power back-off, but suffer from inefficiencies at lower power levels, for very high peak-to-average ratio (PAPR) waveforms, and/or when the output power is not well-centered at the peak of the amplifier's power-dependent efficiency profile.

Moreover, the linearity of a Doherty power amplifier is particularly susceptible to degradation in the presence of load variation. For example, an amplitude distortion (AM/AM) of the carrier amplification stage is a function of the load VSWR, while the AM/AM of the peaking amplification stage is a function of input power, which is typically uncorrelated to the load VSWR.

Conventional saturation detection units suffer from a number of drawbacks. For instance, certain saturation detection schemes include a large design overhead for the power amplifier load such that anticipated load variation presented to the power amplifier does not result in unacceptable levels of compression and linearity degradation. However, such design overhead results in degradation of transmit efficiency and/or increased current drain.

In another example, an isolator is used or loss introduced into the output network of the power amplifier to thereby decrease load variation presented to the power amplifier. However, such an approach also degrades transmit efficiency, increases power consumption, and/or raises cost by increasing component count.

A principle of saturation detection for power amplifiers is explained below using as an example a power amplifier system including a power amplifier and a saturation detector. The power amplifier includes a gain transistor that amplifies an RF input signal to generate an RF output signal, and the saturation detector includes a detection transistor that is thermally coupled to the gain transistor. Additionally, the saturation detector monitors an input voltage to the gain transistor to generate a saturation detection signal indicating a saturation of the gain transistor.

In this example, the saturation detector serves to monitor a compression of the power amplifier, and the saturation detection signal is used to provide an adjustment to reduce or eliminate a performance degradation arising from the compression. For example, the saturation detection signal can be processed using feedback to dynamically adjust a power amplifier's supply voltage, load line, input power, and/or other suitable operating characteristic.

The saturation detectors are not only for detecting a gain compression of a power amplifier, but also for compensation schemes for reducing or eliminating performance degradation arising from saturation.

For example, when the power amplifier is a Doherty power amplifier, a saturation detector can be used to monitor for saturation of the carrier amplification stage, and to provide an adjustment to the peaking amplification stage for compensation when the carrier amplification stage is in saturation. In contrast, a Doherty power amplifier without such compensation has poor performance in the presence of changes of VSWR. For instance, the AM/AM of the carrier amplification stage is a function of the load VSWR, while the AM/AM of the peaking amplification stage is a function of input power, which is typically uncorrelated to the load VSWR. Thus, as mentioned above, severe non-linearity can occur even with low VSWR when the compression characteristic of the carrier amplification stage is in sync with the turn-on characteristic of the peaking amplification stage.

The teachings herein are applicable to a wide variety of RF communication systems, including, but not limited to, base stations, network access points, mobile phones, tablets, customer-premises equipment (CPE), laptops, computers, wearable electronics, and/or other communication devices. Hereinafter, first the principle of saturation detection is explained with reference to a power amplifier system that includes a single power amplifier and a saturation detector.

Power Amplifier System Including Saturation Detection

FIG. 1 illustrates such a power amplifier system 10 including saturation detection. The power amplifier system 10 includes a power amplifier 1 and a saturation detector 3. As shown in FIG. 1, the power amplifier 10 amplifies an RF input signal received at an input terminal RFIN and provides an amplified RF output signal at an output terminal RFOUT. The power amplifier 10 includes a gain transistor 7 operable to amplify the RF input signal into the amplified RF output signal.

The gain transistor 7 can be implemented in a wide variety of ways. In one example, the power amplifier 1 is implemented as a common-emitter amplifier, and the gain transistor 7 corresponds to a bipolar transistor, such as an NPN bipolar transistor. However, other implementations are possible. The power amplifier system 10 of FIG. 1 further includes the saturation detector 3, which includes an input electrically connected to an input of the power amplifier 1. Additionally, the saturation detector 3 includes a detection transistor 8 that is thermally coupled to the gain transistor 7. The saturation detector 3 outputs a saturation detection signal $SAT_{DETECT}$ indicating whether or not the power amplifier 1 is in saturation.

To provide thermal coupling, the power amplifier 1 and the saturation detector 3 can be fabricated on a common substrate of a semiconductor die. Additionally, the gain transistor 7 and the detection transistor 8 can be placed in relatively close proximity.

In a first implementation, a transistor layout of the gain transistor 7 and a transistor layout of the detection transistor 8 are placed within about 20 μm of one another to provide robust thermal coupling.

In a second implementation, a transistor layout of the gain transistor 7 and a transistor layout of the detection transistor 8 are fabricated on a surface of a die's semiconductor substrate.

Additionally, a distance between the transistor layouts is less than about 50% of the thickness of the substrate, or more particularly, less than about 20% of the thickness of the substrate. For instance, heat emanating from the gain transistor 7 can radiate conically into the die's substrate with an angle of about 45° in certain fabrication technologies. Thus, locating the transistor layouts of the gain transistor 7 and the detection transistor 8 within about half the thickness of the die's substrate provides thermal coupling.

In a third example, an array of transistor elements is provided, with a first portion of the transistor elements used to implement the gain transistor 7 and a second portion of the transistor elements used to implement the detection transistor 8.

Although various example implementations for providing thermal coupling have been provided above, thermal coupling can be provided in other ways. For example, an implementation of transistor layouts sufficient to achieve thermal coupling can depend on a variety of factors, such as processing technology, circuit design, and/or amplifier operating parameters. Accordingly, other implementations are possible.

In certain implementations, the gain transistor 7 and the detection transistor 8 can be of a common transistor type and polarity, for instance, NPN bipolar transistors. Additionally, the input of the gain transistor 7 and the input of the detection transistor 8 are both electrically connected to the input terminal RFIN. For instance, in an implementation using NPN bipolar transistors, both a base of the gain transistor and a base of the detection transistor 8 can be electrically connected to the input terminal RFIN.

By implementing, the power amplifier system 10 in this manner and with thermal coupling between the transistors, the conduction of the detection transistor 8 can track the saturation of the gain transistor 7. For example, the detection transistor 8 can control the signal level of the saturation detection signal SAT$_{DETECT}$ to indicate whether or not the power amplifier 1 is in saturation.

It should be understood that the principle of thermal coupling described above for the gain transistor 7 and the detection transistor 8 equally well applies to all other saturation detection transistors and gain transistors described in the present disclosure.

In order to set a modulation bandwidth for detection of saturation, the saturation detector 3 may include a modulation bandwidth filter, such as a resistor-capacitor (RC) filter, for setting a modulation bandwidth used for detection. For example, the modulation bandwidth filter can be included between an input of the saturation detector 3 and an input to the detection transistor 8. Including a modulation bandwidth filter can aid in providing detection over a modulation bandwidth suitable for a particular RF input signal but has, explained below, also other effects.

FIG. 2A is a schematic diagram of a concrete example of a power amplifier system 50 with saturation detection in FIG. 1. The power amplifier system 50 includes a power amplifier 21 and a saturation detector 23 similarly as in FIG. 1.

As shown in FIG. 2A, the power amplifier 21 amplifies an RF input signal received at an input terminal RFIN and provides an RF output signal at an output terminal RFOUT. The power amplifier 21 includes a bias circuit 25, a first bias resistor 27, a DC blocking capacitor 28, and a bipolar gain transistor 37 operable to amplify the RF input signal. In the illustrated embodiment, the bias circuit 25 is powered by a battery voltage VBATT, and includes a reference current source 31, a diode 32, a second bias resistor 33, a bias capacitor 34, a first bipolar bias transistor 35, and a second bipolar bias transistor 36.

Although one example of a power amplifier is depicted in FIG. 2A, the teachings herein are applicable to power amplifiers implemented in a wide variety of ways. For example, the same detection principle as in FIGS. 1 and 2A may be used in connection with a Doherty power amplifier including a carrier amplification stage and a peaking amplifier stage, as will be explained below.

In FIG. 2A, the saturation detector 23 includes a bipolar detection transistor 38, a modulation bandwidth filter 39, and a detection resistor 41. Additionally, the modulation filter 39 includes a filter resistor 43 and a filter capacitor 44. The bipolar detection transistor 38 is thermally (as explained above) coupled to the bipolar gain transistor 37, and includes a base electrically connected to a base of the bipolar gain transistor 37 through the modulation bandwidth filter 39, an emitter electrically connected to ground, and a collector electrically connected to a power supply voltage through the detection resistor 41. The collector of the bipolar detection transistor 38 provides a detection voltage VSAT_DETECT.

In this example, the gain transistor and the detection transistor are implemented as thermally coupled NPN bipolar transistors. Additionally, the detection transistor serves to detect small changes in the base voltage and to provide process and temperature compensation.

The power amplifier system 50 can be implemented with a wide range of component values. In one example, the bipolar gain transistor 37 has an emitter area AE, the bipolar detection transistor 38 is a factor k (for instance, ten or more) smaller than the bipolar gain transistor 37, the diode 32 has an area 5 gm², the first bipolar bias transistor 35 has an emitter area M*5 gm², the second bipolar bias transistor 36 has an emitter area AE/M, the first bias resistor 27 has a resistance RB, and the second bias resistor 33 has a resistance M*RB. Although one specific example of component values has been provided, the power amplifier system 50 can be implemented with a wide range of component values. In the illustrated embodiment, the saturation detector 23 includes the modulation bandwidth filter 39, which is implemented as an RC filter, in this example. The modulation bandwidth filter 39 aids in setting a modulation bandwidth used for detection, thereby providing detection over a modulation bandwidth suitable for a particular RF input Although illustrated as including fixed components, in certain implementations a modulation bandwidth filter includes one or more controllable components. For example, in certain implementations, at least one of a resistance of the filter resistor 43 or a capacitance of the filter capacitor 44 is controllable or adjustable, for instance, digitally programmed based on data receiver over a chip interface or bus.

Including one or more controllable components in a modulation bandwidth filter provides a number of advantages, such as an ability to compensate for process, voltage, and/or temperature (PVT) variation and/or to provide dynamic adjustment to the modulation bandwidth based on characteristics of the RF input signal, such as frequency band and/or signal bandwidth.

Figure 2B:
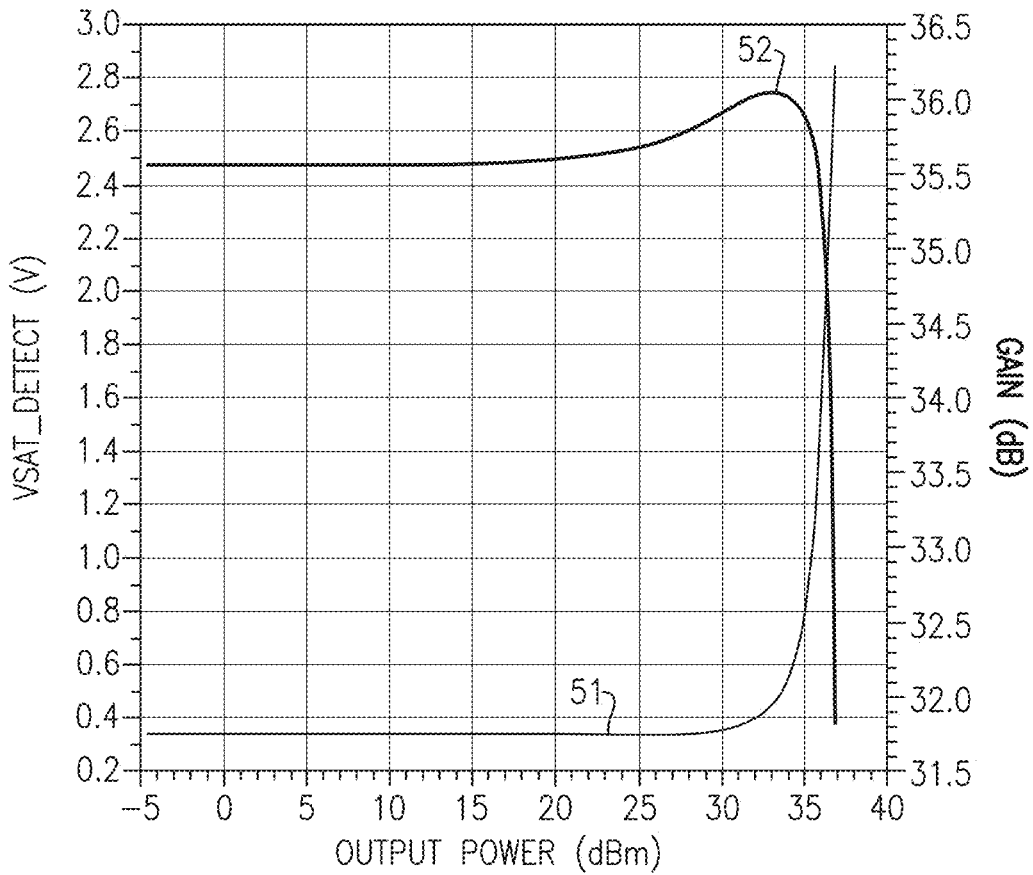
FIG. 2B is a graph of one example of saturation detection signal level and power amplifier gain versus output power.

FIG. 2B is a graph of one example of saturation detection signal level and power amplifier gain versus output power. The graph includes a first plot 51 of the detection voltage VSAT_DETECT versus output power, and a second plot 52 of gain of the power amplifier 21 versus output power.

Although one example of simulation results are depicted, simulation results can vary based on a wide variety of factors, such as design implementation and/or simulation tools, models, and/or parameters. Accordingly, other results are possible.

In the illustrated example, the saturation detector is implemented to detect for very small changes in base voltage, for instance, tens of mV. Additionally, the detection voltage VSAT_DETECT is implemented to have a low voltage when the power amplifier 21 is not saturated, and to have a high voltage when the power amplifier 21 is saturated.

FIG. 3 is a schematic diagram of another example of a power amplifier system 70 with saturation detection. The power amplifier 70 includes a power amplifier 21, a saturation detector 23, a power management circuit 61, and an inductor 62.

The power amplification system 70 of FIG. 3 is similar to the power management system 50 of FIG. 2A, except that the power amplifier system 70 further includes the power management circuit 61 and the inductor 62.

As shown in FIG. 3, the power management circuit 61 outputs a power amplifier supply voltage Vcc, which is provided to the power amplifier 21 through the inductor 62. The power amplifier supply voltage Vcc serves to supply power to the power amplifier 21. For example, the power amplifier supply voltage Vcc controls a DC collector voltage of the bipolar gain transistor 37, in this example. The power management circuit 61 can be implemented in a wide variety of ways, such as using a power management integrated circuit (PMIC). In certain implementations, the power management circuit 61 includes a DC-to-DC converter, such as a buck-boost switching regulator, used to generate the power amplifier supply voltage V cc based on the battery voltage VBATT of a battery.

In the illustrated embodiment, the voltage level of the power amplifier supply voltage Vcc is controlled based on the saturation voltage VSAT_DETECT. For example, in response to the saturation voltage VSAT_DETECT indicating that the power amplifier 25 has saturated, the power management circuit 61 can increase the voltage level of the power amplifier supply voltage Vcc. This also applies to other embodiments and examples in the present disclosure when a saturation detection signal is output in a power amplifier system.

Although the illustrated embodiment includes a power management circuit that receives a saturation detection signal, the teachings herein are applicable to power amplifier systems that process a saturation detection signal in a wide variety of ways. In another example, a control circuit decreases a load line impedance of a power amplifier in response to a saturation detection signal indicating that the power amplifier has saturated. In yet another example, a control circuit decreases an input power of a power amplifier in response to a saturation detection signal indicating that the power amplifier has saturated.

Accordingly, power amplifier systems can process a saturation detection signal in a wide variety of ways and particularly also in technical manners described below for FIGS. 7-9.

Doherty Power Amplifier System Including Saturation Detection

Figure 4:
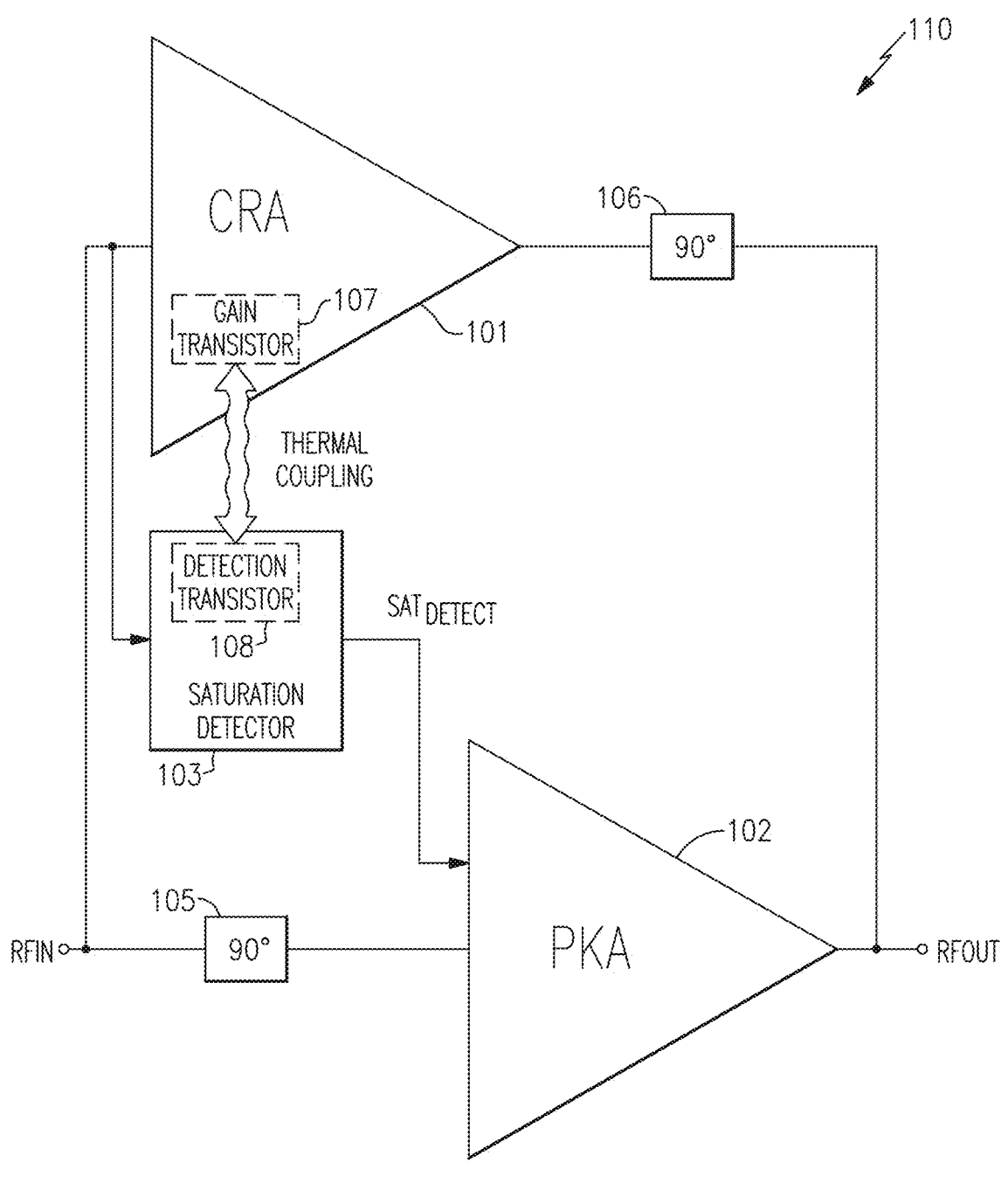
FIG. 4 is a schematic diagram of another embodiment of a power amplifier system with saturation detection for a Doherty amplifier operating on single-ended input and output signals.
Figure 5:
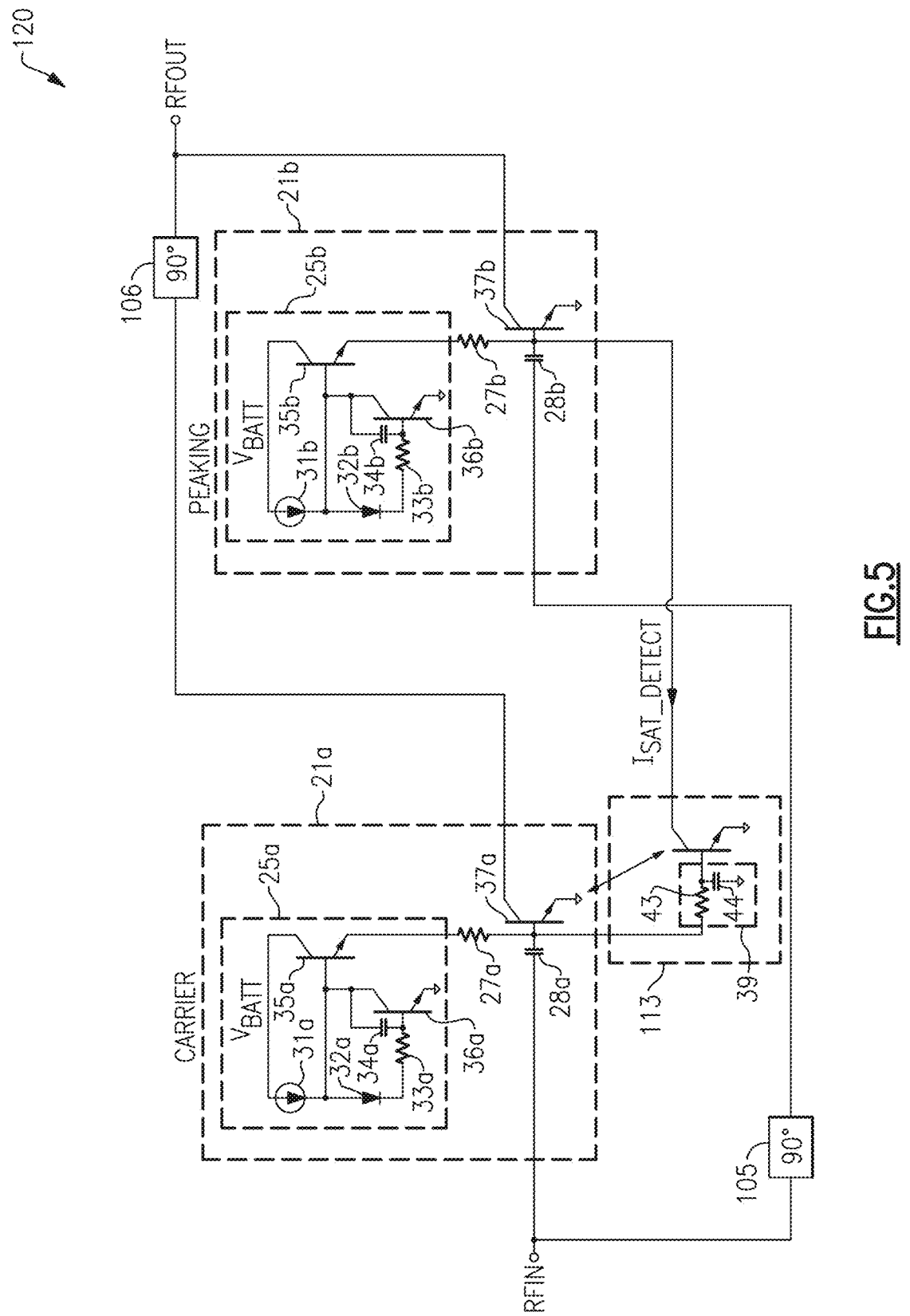
FIG. 5 is a schematic diagram of another embodiment of a power amplifier system with saturation detection for the Doherty power amplifier of FIG. 4.

FIG. 4—with FIG. 5 showing a specific implementation of FIG. 4—is a schematic diagram of another example of a power amplifier system 110 with saturation detection using a Doherty amplifier system. The power amplifier system 110 includes an amplifier including a carrier amplification stage 101, a peaking amplification stage 102, an input phase shifter 105, and an output phase shifter 106. The power amplifier system 110 further includes a saturation detector 103 similarly to those in FIGS. 1 and 2A.

The Doherty power amplifier system 110 of FIG. 4 illustrates one example of a Doherty power amplifier implemented with saturation detection. Although one embodiment of a Doherty power amplifier implemented with saturation detection is shown, the teachings herein are applicable to power amplifiers implemented in a wide variety of ways, including other implementations of Doherty power amplifiers. For example, whilst FIG. 4 shows a Doherty power amplifier system operating on single-ended signals, the carrier amplification stage and the peaking amplifier stage may be realized as differential amplifier stages operating on differential (push-pull) signals.

As shown in FIG. 4, the RF input signal received from the input terminal RFIN is provided to an input of the carrier amplification stage 101 and to the input phase shifter 105. Additionally, the input phase shifter 105 phase shifts the RF input signal (by about ninety degrees at the fundamental frequency, in this example) to generate a phase shifted RF input signal for the peaking amplification stage 102. However, other implementations are possible. For instance, in another examples, a 3 dB or hybrid coupler is used to split the RF input signal into a pair of signals having a phase difference of about ninety degrees. This also applies to other embodiments/examples of a Doherty amplifier system described in the present disclosure, in particular those using virtual ground(s).

In FIG. 4, the carrier amplification stage 101 outputs a carrier signal, while the peaking amplification stage 102 outputs a peaking signal.

Additionally, the carrier signal is phased-shifted by the output phase shifter 106 (by about ninety degrees at the fundamental frequency, in this example), and thereafter combined with the peaking signal to generate an RF output signal for the output terminal RFOUT. However, other implementations are possible. For instance, a 3 dB or hybrid coupler can be used to combine the carrier signal and the peaking signal. This also applies to other embodiments/examples of a Doherty amplifier system described in the present disclosure.

In the illustrated example, the carrier amplification stage 101 includes a gain transistor 107, and the saturation detector (unit) 103 includes a detection transistor 108 that is thermally coupled to the gain transistor 107. Additionally, the input of the saturation detector 103 is electrically connected to the input of the carrier amplification stage 101. Furthermore, the saturation detector 103 outputs a saturation detection signal $SAT_{DETECT}$ which is provided to the peaking amplification stage 102.

The saturation detection signal $SAT_{DETECT}$ is processed by the peaking amplification stage 102 to compensate the power amplifier system 110 for saturation of the carrier amplification stage 101, as explained above is one of the fundamental tasks of all saturation detection units in the present disclosure.

In many implementations of the present disclosure relating to saturation detection units, a saturation detection signal $SAT_{DETECT}$ may adjust a bias level of the peaking amplification stage 102 to compensate for saturation of the carrier amplification stage 101. For example, the saturation detection signal $SAT_{DETECT}$ can serve to turn on the peaking amplification stage 102 at the appropriate time regardless of supply voltage and/or load line condition.

Accordingly, the power amplifier system 110 can be implemented such that the peaking amplification stage 102 turns on in response to saturation of the carrier amplification stage 101. Thus, the turn-on characteristic of the peaking amplification stage 101 can be a function of the compression of the carrier amplification stage 102 rather than input power alone. Accordingly, linearity of the Doherty power amplifier is improved over variation in load VS WR, process, and/or temperature.

In contrast, a Doherty power amplifier without such compensation has poor performance in the presence of changes of VSWR. For instance, AM/AM of a carrier amplification stage of such a Doherty power amplifier is a function of the load VSWR, while the AM/AM of the peaking amplification stage of the Doherty power amplifier is a function of input power, which is typically uncorrelated to the load VSWR. Thus, severe non-linearity can occur even with low VSWR when the compression characteristic of the carrier amplification stage is in sync with the turn-on characteristic of the peaking amplification stage.

FIG. 5 is a schematic diagram of a more specific example of a power amplifier system 120 with saturation detection. The power amplifier system 120 works on single-ended signals and includes a Doherty power amplifier including a carrier amplification stage 21*a*, a peaking amplification stage 21*b*, an input phase shifter 105, and an output phase shifter 106. The power amplifier system 110 further includes a saturation detector 113. The carrier amplification stage 21*a* and the peaking amplification stage 21*b* are each implemented using a configuration similar to that of the power amplifier 21 of FIG. 2A. For example, the carrier amplification stage 21*a* includes a bias circuit 25*a*, a first bias resistor 27*a*, a DC blocking capacitor 28*a*, and a bipolar gain transistor 37*a*. Additionally, the bias circuit 25*a* is powered by a battery voltage V$_{BATT}$, and includes a reference current source 31*a*, a diode 32*a*, a second bias resistor 33*a*, a bias capacitor 34*a*, a first bipolar bias transistor 35*a*, and a second bipolar bias transistor 36*a*. The peaking amplification stage 21*b* includes a bias circuit 25*b*, a first bias resistor 27*b*, a DC blocking capacitor 28*b*, and a bipolar gain transistor 37*b*. Additionally, the bias circuit 25*b* is powered by the battery voltage V$_{BATT}$, and includes a reference current source 31*b*, a diode 32*b*, a second bias resistor 33*b*, a bias capacitor 34*b*, a first bipolar bias transistor 35*b*, and a second bipolar bias transistor 36*b*. The saturation detector 113 of FIG. 5 is similar to the saturation detector 23 of FIG. 2A, except that the saturation detector 113 omits the detection resistor 41 of FIG. 2A in favor of generating a saturation detection current I$_{SAT\_DETECT}$.

In the illustrated example, the saturation detection current I$_{SAT\_DETECT}$ is provided to the base of the bipolar gain transistor 37*b* of the peaking amplification stage 21*b*. When the carrier amplification stage 21*a* is not in saturation, the saturation detection current I$_{SAT\_DETECT}$ is high to pull down the base of the bipolar gain transistor 37*b* and turn off the peaking amplification stage 21*b*. However, when the carrier amplification stage 21*a* is in saturation, the saturation detection current I$_{SAT\_DETECT}$ is low and the bias circuit 25*b* pulls the base of the bipolar gain transistor 37*b* up to bias the peaking amplification stage 21*b* for amplification (for instance, in class AB operation).

FIGS. 4 and 5 show an example of a Doherty amplifier 120 operating on single-ended signals with a saturation detection circuit 113 including a detection transistor and a low-pass filter 39. Hereinafter, some principles of the invention will be explained with reference to a simple example of a saturation detector operating in a differential amplifier according to various embodiments of the invention. A push-pull (differential) Doherty amplifier with a detection circuit similar to the one illustrated in FIG. 5 will be applied, however, using a virtual ground which only applies for differential stage Doherty amplifiers.

Differential Power Amplifier Stage Using Virtual Ground Saturation Detection

As explained above, the linearity of the power amplifier is directly related to the level of gain compression within the amplifier. Often, the power amplifier is designed for a fixed supply voltage which defines the target load impedance for acceptable linearity. Unfortunately, the extreme environment of for example mobile handsets (where such power amplifiers are typically used) results in a significant variation of the load which is presented to the power amplifier device. As a result, the power amplifier linearity degrades in the mobile application causing for example degraded spectral performance.

Furthermore, when using the principle of saturation detection, for example in the power amplifier system with saturation detection shown in FIG. 2A or even in the power amplifier system with saturation detection for a Doherty power amplifier in FIG. 5, the saturation detectors 23, 113 use large isolation resistors and bypass capacitors to isolate the saturation detection device from RF corruption. These resistors and capacitors form an RC network that limits the video (that is modulation) bandwidth of the network. This results in degraded linearity or ACLR with wider bandwidth modulations and this is especially critical for new radio (NR) 5G signals. These limitations regarding non-linearity, use of large resistors and bypass capacitors with bandwidth limitations occur irrespective of the type of power amplifier. For example, these limitations are also present in the Doherty power amplifier described above with reference to FIG. 5.

Furthermore, these limitations are also present irrespective of whether the power amplifier stage operates on single-ended signals or differential signals. For example, all power amplifier stages described above with reference to FIG. 1-5 operate on single-ended signals. However, the same limitations are present even if the power amplifier operates on differential signals.

Figure 6A:
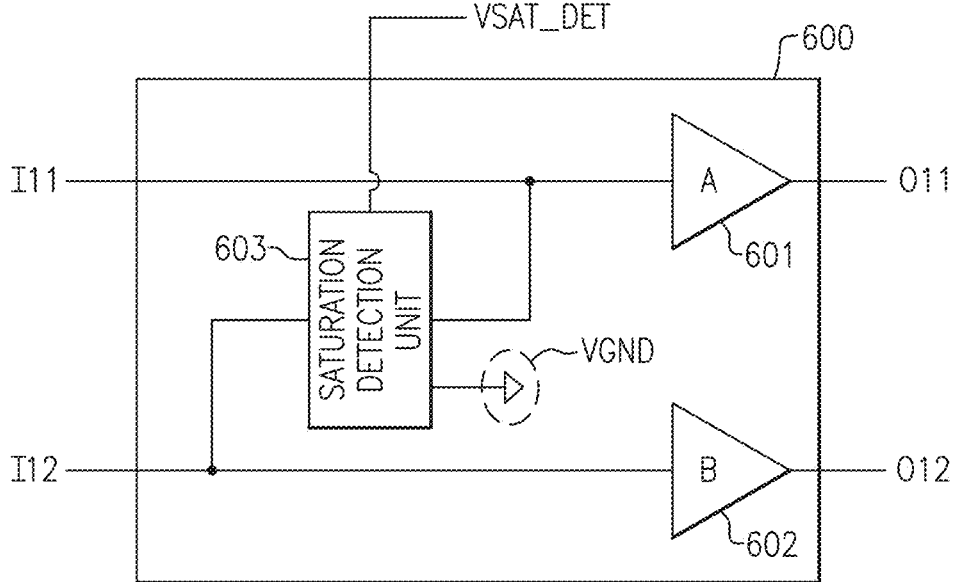
FIG. 6A is a schematic diagram of a power amplifier with a differential power amplification stage operating on differential signals and comprising a saturation detection circuit establishing a virtual ground according to the invention.

In order to remedy these disadvantages, FIG. 6A shows a differential power amplification stage 600 operating on differential signals. This differential power amplification stage 600 uses a virtual ground for RF isolation rather than bypass capacitors as in FIG. 5. This results in an approximately two times increase in the bandwidth supported by the circuit with reduced RF corruption.

The differential power amplification stage 600 of FIG. 6A comprises a first amplification unit 601 (in differential amplifiers also denoted as the A amplification unit), a second amplification unit 602 (in differential power amplifiers also denoted as the B amplification unit), and a saturation detection unit 603 which is connected to the inputs of the first and second amplification units 601, 602. The first amplification unit 601 is adapted to amplify a first differential signal I11 and to output an amplified first differential signal O11. The second amplification unit 602 is adapted to amplify a second differential signal I12 and to output an amplified second differential signal O12. As is typical in such differential power amplification, the first differential signal I11 and the second differential signal I12 input to the respective amplification units 601, 602 have opposite phase with respect to each other.

In principle, the saturation detection unit 603 has the same functionality as the saturation detectors 23, 113 shown in FIG. 2A and in FIG. 5 (that is to detect gain saturation of the first and/or second amplification unit 601, 602 but it operates on the principle of virtual grounds which is indicated with the virtual ground VGND. That is, the saturation detection unit 603 provides a virtual ground for the first and second differential signals for RF cancellation on the first and second differential signals I11, I12.

Generally, a virtual ground can be a node of a circuit that is at a steady reference potential, without being directly connected to the reference potential. In terms of the use of virtual grounds in systems operating on differential signals, a virtual ground can be a potential or a node established at which signals having opposite phase will cancel each other. The principle of virtual grounds is used in FIG. 6A in order to cancel RF on the first and second differential signals. The saturation detection unit 604 can establish such a virtual ground VGND for RF cancellation and still outputs the saturation detection signal VSAT DET.

Figure 6B:
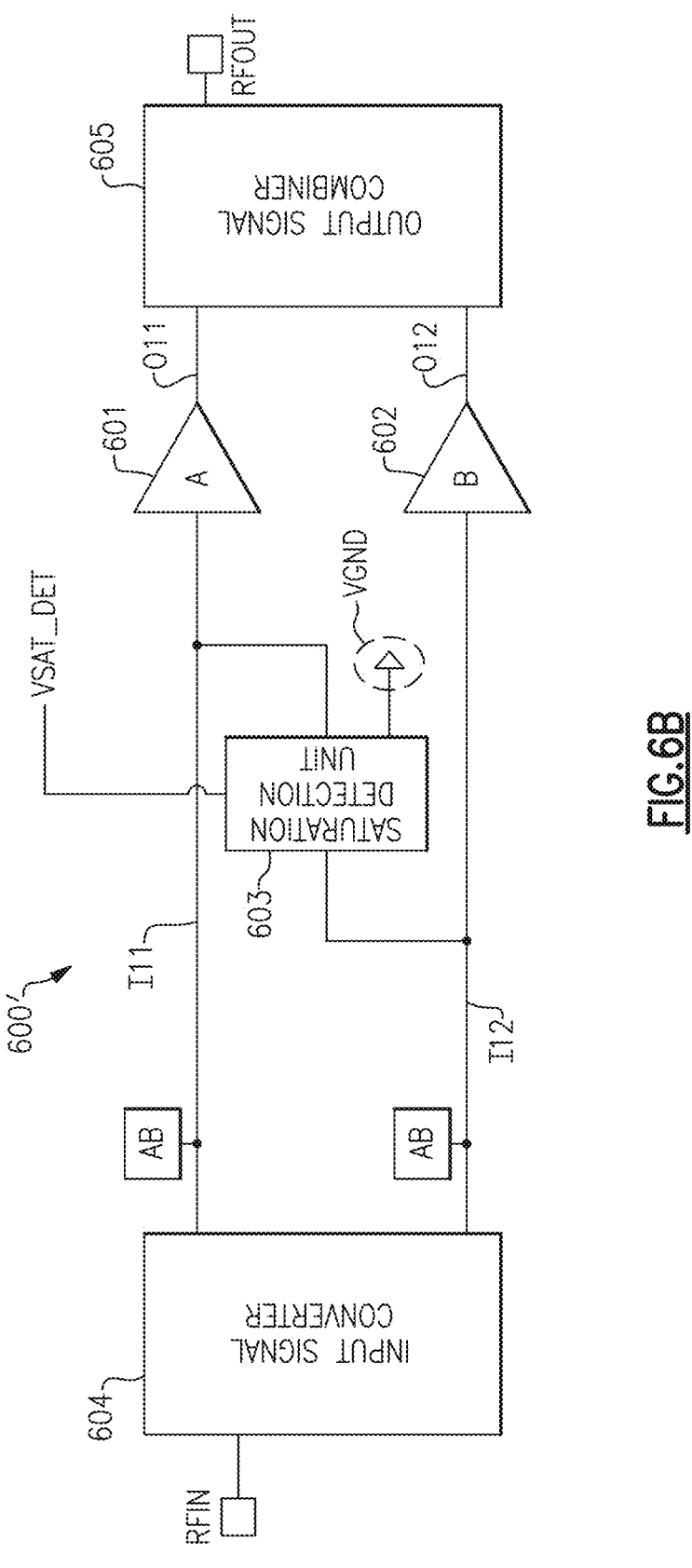
FIG. 6B is an embodiment of the differential power amplification stage of FIG. 6A with an input signal converter and an output signal combiner.

FIG. 6B shows an embodiment of the differential power amplification stage 600 of FIG. 6A. The differential power amplification stage 600' in FIG. 6B additionally comprises an input signal converter 604 including an input to receive a single-ended radio frequency, RF, input signal RFIN. The input signal converter 604 converts the single-ended RF input signal RFIN into the first and second differential signals I11, I12. The power amplification stage 600' in FIG. 6B also comprises an output signal combiner 605 adapted to combine the first and second amplified differential signals O11, O12 into an amplified single-ended output signal RFOUT. Such a differential power amplifier stage including the input signal converter 604 and the output signal converter 605 which receives a single-ended input signal RFIN and outputs a single-ended output signal RFOUT can be used for any of the power amplifiers in FIGS. 1-5 and FIGS. 10-14 described below. It can also be used in the mobile devices and envelope trackers which will be described below.

Typically, as will also be seen below with the embodiments of FIG. 6B, the first and second amplification units 601, 602 in FIG. 6A and FIG. 6B comprise a bipolar gain transistor (NPN transistor or PNP transistor). Furthermore, also the saturation detection unit 603 comprises bipolar transistors, as is shown with more details in the embodiment of the differential power amplifier stage 600'' shown in FIG. 6C.

Figure 6C:
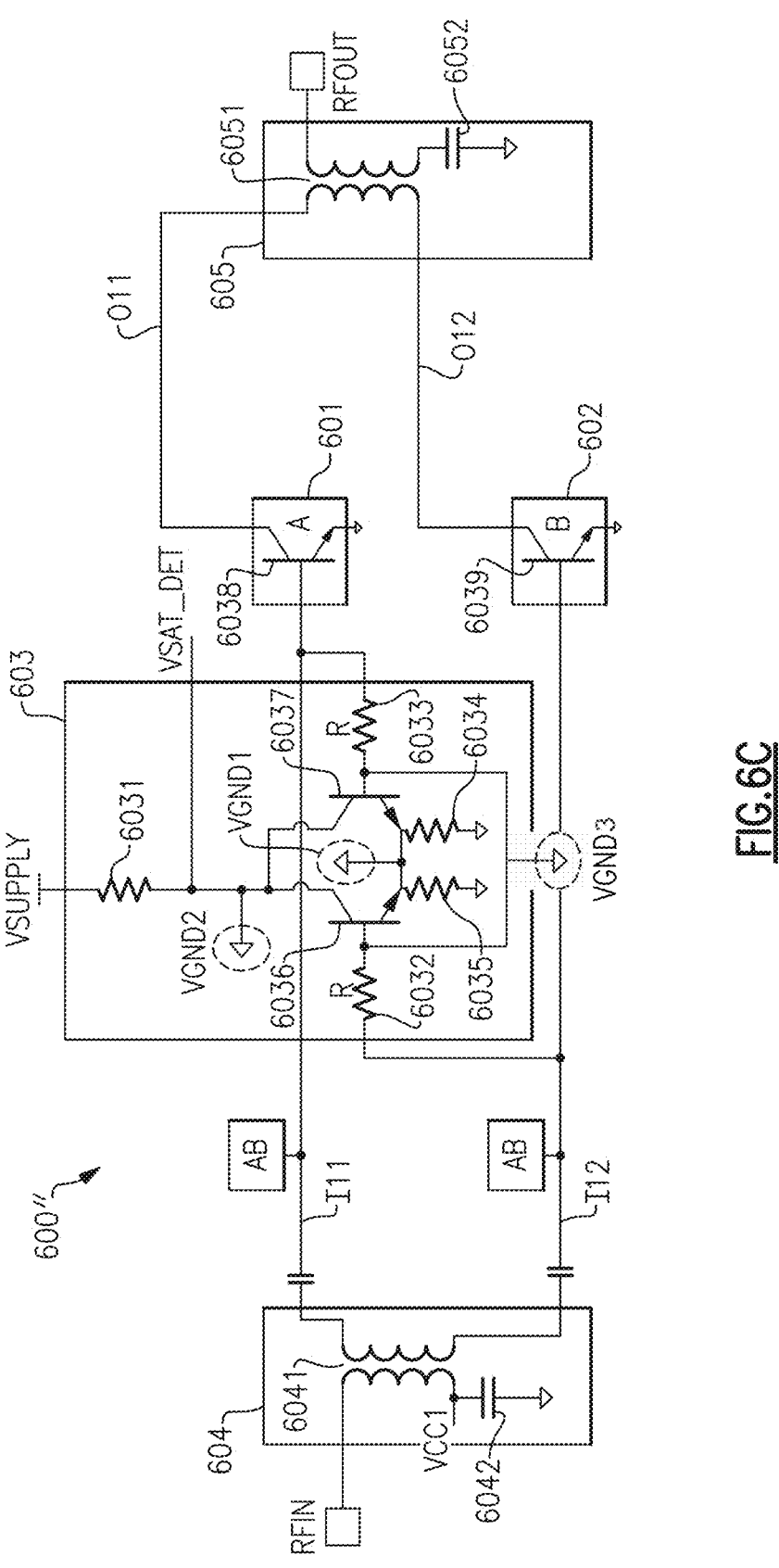
FIG. 6C is a concrete circuit diagram of the differential power amplification stage of FIG. 6B according to an embodiment of the invention.

Like the power amplifier stage 600' in FIG. 6B, the power amplifier stage 600'' in FIG. 6C comprises the input signal converter 604 and the output signal combiner 605, both realized by transformers 6041, 6051 and capacitors 6042, 6052. One end of the primary winding of the first transformer 6041 and one end of the secondary winding of the second transformer 6051 is connected to ground via the respective capacitor 6042, 6052. This allows the input signal converter 604 to convert the input signal RFIN into the differential signals I11, I12 having opposite phases which are input the amplification units 601, 602. The construction of the output signal combiner 605 allows to combine the differential amplified signals O11, O12 having opposite phases to be combined into the single-ended output signal RFOUT. According to an embodiment of the invention, the amplification units 601, 602 are respectively realized by NPN bipolar transistors 6038, 6039.

In FIG. 6C, the saturation detection unit 603 comprises a first bipolar detection transistor 6037 having a base thereof connected to a base of the gain transistor 6038 of the first amplification unit 601 (through the resistor 6033), having an emitter thereof connected to ground via a first resistor 6034, and having a collector which is connected to the collector of the second bipolar detection transistor 6036. The connected collectors are connected to the power supply voltage VSUP-PLY through a third resistor 6031.

The second bipolar detection transistor 6036 has a base thereof connected to a base of the gain transistor 6039 of the second amplification unit 602 (through the resistor 6032), has an emitter thereof connected to ground via a second resistor 6035 and having its collector, as mentioned before, connected to the collector of the first bipolar detection transistor 6037.

As was already described with reference to the saturation detectors 23, 113 in FIGS. 2A-5, also the first bipolar detection transistor 6037 and the second bipolar detection transistor 6036 are respectively thermally coupled to the respective gain transistor 6038, 6039 of the respective amplification units 601, 602 (not shown in FIG. 6C).

The differential power amplifier stage 600'' of FIG. 6C uses the principle of virtual grounds for RF cancellation on the differential signals shown in FIG. 6C. In particular, by coupling the collectors and the emitters of the first detection transistor 6037 and the second detection transistor 6036, a first virtual ground is established at the emitters denoted with VGND1 and a second virtual ground is established at the collectors denoted with VGND2. As also shown in FIG. 6C, the connected collectors output the saturation detection signal VSAT DET indicating the gain saturation of the gain transistors 6038, 6039 of the first and second amplifier unit 601, 602. A third virtual ground denoted with VGND3 is established at the connected bases of the first and second detection transistors 6036 and 6037.

As can be seen from FIG. 6C, in contrast to using a network of capacitors and resistors, with the inherent bandwidth limitations, the differential power amplifier stage 600'' in FIG. 6C uses virtual grounds for RF isolation rather than bypass capacitors. This results in the aforementioned approximately two times increase in the bandwidth supported by the circuit with reduced RF corruption. The virtual grounds established by the connected collectors and emitters cancel the radio frequencies present on the differential signals in the power amplification stage 600''. At the same time, the saturation detection unit 603 allows to detect gain saturation of the gain transistors 6038, 6039.

In FIG. 6C, the input signal converter 604 comprises the transformer 6041 with the primary winding and a secondary winding where a first terminal of the primary winding receives the single-ended RF input signal RFIN and the second terminal of the primary winding is connected to ground through the capacitor 6042. The second terminal of the primary winding is thus connected to ground. The first terminal of the secondary winding of the transformer 6041 outputs the first differential signal I11 and the second terminal of the secondary winding outputs the second differential signal I22. Thus, the signals I11, I12 have opposite phases to each other.

Likewise, the output signal combiner 605 comprises a transformer 6051 having a primary winding and a secondary winding, where a first terminal of the primary winding receives the first amplified differential signal O11 and the second terminal of the primary winding receives the second amplified differential signal O12. A first terminal of the secondary winding of the output signal combiner 605 outputs the single-ended amplified RF output signal RFOUT and a second terminal of the secondary winding is, similarly as with the input signal converter 604, connected to ground via a capacitor 6052.

Effects of the Differential Power Amplifier Stage Using Virtual Grounds

The usage of a saturation detection unit 603 only comprising resistors and transistors has major advantages over saturation detectors using capacitors as wideband RF bandpass filters, regarding bandwidth limitations and also regarding the actual implementation processes on a chip or die. In particular, a design of a wideband RF bandpass filter with steep passband edges requires that the resonators comprising the filter have independently adjustable frequencies, impedances, and coupling constants. If such a filter is to fit in an ultra-miniature footprint it can in principle be fabricated en-mass using an on-wafer BAW microfabrication process which can then be singulated into individual filters. It is fairly straightforward to implement such a BAW process having independently adjustable frequencies and impedances by controlling the layer thicknesses and areas of each of the resonators respectively, but in order to be able to independently adjust the coupling constants of each resonator requires the use of on-die capacitors electrically in parallel with particular resonators comprising the filter.

It is impractical to implement capacitors of the saturation detectors in FIGS. 1-5 with surface mount devices (SMDs) or other off-die components because doing so would significantly increase the total module area and would also increase the number of input/output pins and routing complexity on the filter die.

MIM (metal-insulator-metal) or MOM (metal-oxide-metal) capacitors, on the other hand, could be integrated into a BAW wafer process to serve as capacitors but extra processing steps would be required to deposit a reliable, controllable, pin-hole-free oxide or insulator layer. Furthermore, such additional process steps also add cost and complexity in the fabrication process.

In addition, while conventional RESCAP solutions are cost effective and relatively simple to implement, this still requires design effort in layout and fabrication to prevent membrane cracking. Unlike regular BAW resonators, the addition of an extra-thick metal layer above or below a top electrode makes the control of membrane stress within acceptable levels more challenging. Excessive stress in such a membrane together with a resonator's membrane release holes imposes a much higher risk for (suspended) membrane cracking and hence constrains the size and shape of the RESCAP that can be manufactured. Therefore, the usage of an RC network as in FIG. 2A or FIG. 5 not only presents bandwidth limitations but also constrains that prohibit a compact filter die design.

The design in FIG. 6C addresses this need for an on-die capacitor (RESCAP) with stress mitigation in a compact area through the patterning of the silicon substrate underneath the resonator to support the thick-metal membrane in the center, middle, and/or perimeter of the capacitor. Interior support posts can help to reduce strain (bow/warpage) of the membrane.

The resistor and transistor realization of the saturation detection unit 603 in FIG. 6C also has the benefit of 1) improved reliability and yield rate of RESCAP with stress mitigation through the Si support, 2) enablement of an implementation of RESCAP of different sizes and shapes, and 3) consumption of minimal additional die area with great flexibility to fit in available spaces.

Thus, not using capacitors for the RF filtering, in particular of RF noise on the differential signals, does not only overcome the bandwidth limitations but also presents major advantages regarding the manufacturing of the power amplifier on a die.

Whilst the improvement regarding the bandwidth and the manufacturing of the saturation detection unit 603 are already present in a push-push (differential) differential power amplifier stage 600, 600', 600" shown in FIG. 6A, FIG. 6B and FIG. 6C, these effects are particularly useful when the differential power amplifier stage of FIG. 6 is used in a Doherty power amplifier which in principle uses the differential amplifier unit of FIG. 6 as a differential peaking amplifier stage and a differential carrier amplifier stage. This will be explained below with reference to FIGS. 7A-7E, which relate to such a Dougherty power amplifier design.

Doherty Power Amplifier Using Virtual Ground Saturation Detection

Figure 7A:
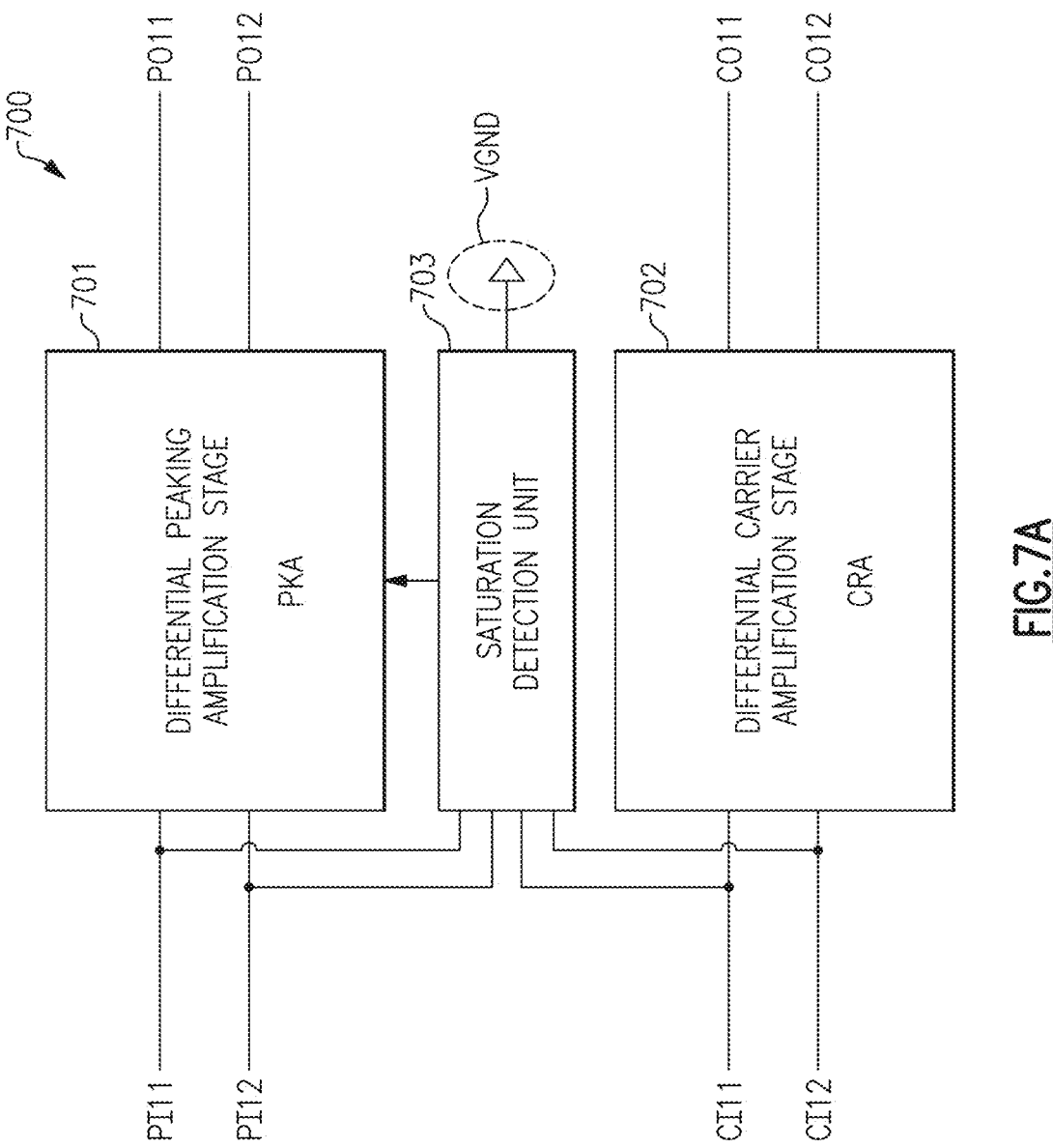
FIG. 7A illustrates a block diagram of a Doherty power amplifier according to the invention operating on differential signals and including a saturation detection unit using virtual grounds.

The Doherty power amplifier 700 in FIG. 7A is similar to the Doherty power amplifier with saturation detection in FIG. 5. However, the Doherty power amplifier 700 has two amplification stages 701, 702 both of which operate on differential signals. Therefore, this Doherty power 700 is a so-called differential or push-pull Doherty amplifier in contrast to the Doherty power amplifier in FIG. 4 and FIG. 5 working on single-ended signals.

The differential peaking amplification stage 701 (the PKA) receives differential input signals PI11, PI12 having opposite phases and outputs amplified differential signals PO11, PO12 having opposite phases to each other. The differential carrier amplification stage (the CRA) 702 receives differential input signals CI11, CI12 having opposite phases and outputs amplified differential signals are CO11, CO12 having opposite phases to each other. As will be seen below, each of the PKA 701 and CRA 702 are constituted as differential power amplifier (push-pull power amplifier) similar to the differential power amplifier in in FIG. 6A.

The saturation detection unit 703 is adapted to detect a gain saturation of the differential carrier amplification stage 702 and to drive the differential peaking amplification stage 701 based on the detected gain saturation on the differential carrier amplification stage 702. In this respect, the saturation detection unit 703 carries out a similar functionality as the saturation detector 113 in FIG. 5 with the difference that, as just explained, the PKA and the CRA are each constituted as a differential (push-pull) amplification stage operating on differential signals.

Furthermore, unlike the saturation detector 113 in FIG. 5 using RC networks, the saturation detection unit 703 in FIGS. 7A-7E provides a virtual ground (indicated with VGND) for the differential signals of the differential carrier amplification stage 702 for RF cancellation on the differential signals. Hence, the power amplifier of FIG. 7A operates on differential signals and virtual ground(s) but otherwise operates in the same amplification and saturation detection principle as in FIG. 5. The saturation detection unit 703 maintains the Doherty power amplifier's ACLR into mismatch and turns on/off the peaking amplifier stage 701 for tracking the compression of the carrier amplification stage 702.

Using the virtual ground VGND created in the saturation detection unit 703 for RF cancellation on the differential signals of the differential amplifier stages increases the bandwidth (see FIG. 8 discussed below) and reduces RF corruption. The virtual ground is particularly useful in the differential amplification stages using differential signals which respectively have opposite phases to each other.

Whilst the Doherty power amplifier in FIG. 5 uses capacitors for the RF cancellation and operates on single-ended signals, no capacities need to be used in the Doherty power amplifier in FIG. 7A because the saturation detection unit 703 operates on differential signals and is adapted to provide a virtual ground for the differential signals of the differential carrier amplification stage. This cancels RF on the differential signals without the need of using RRC circuits.

Figure 7B:
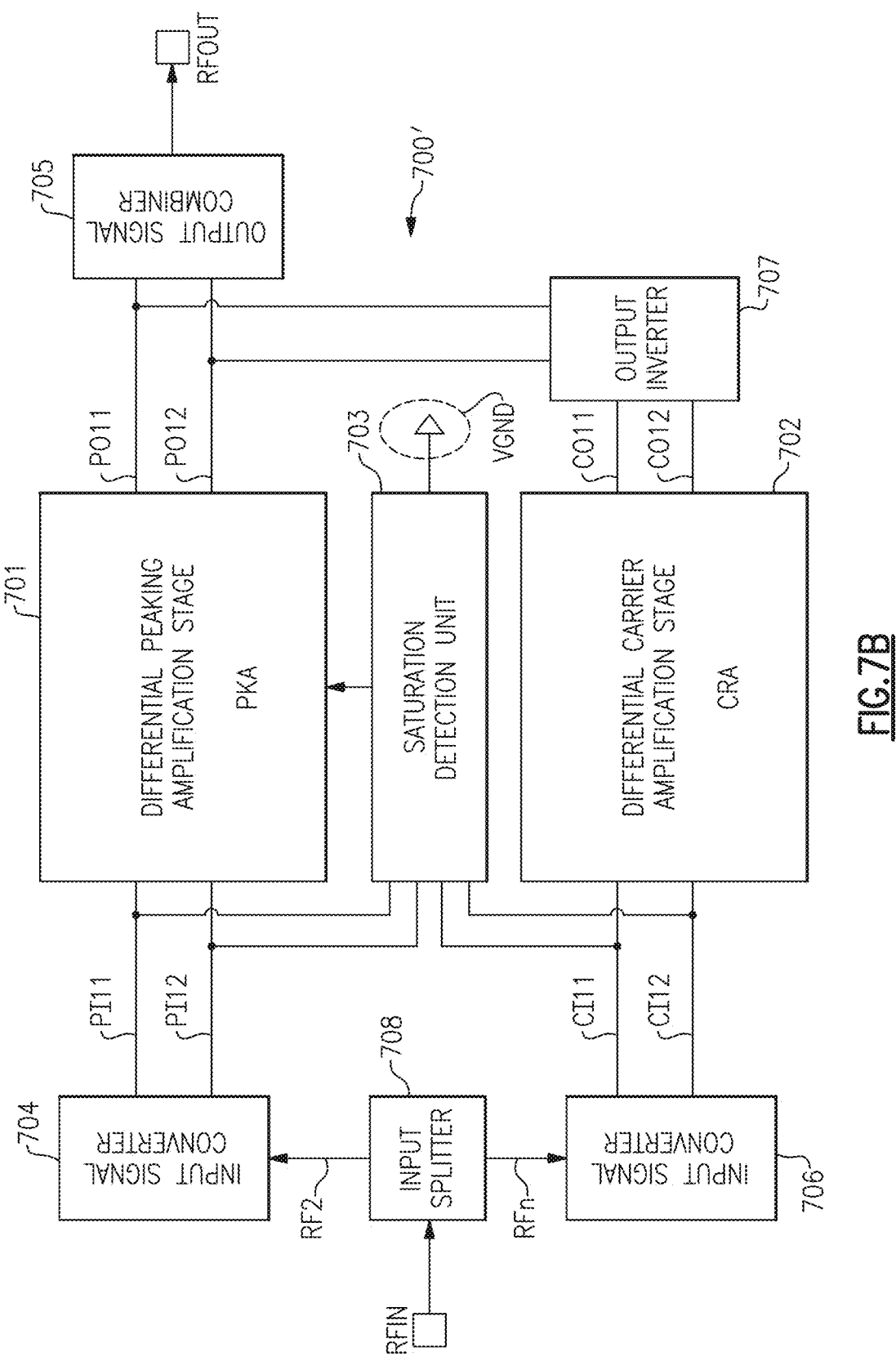
FIG. 7B illustrates the Doherty power amplifier of FIG. 7A with further input and output devices for amplifying a single-ended RF input signal RFIN into an amplified single-ended RF output signal RFOUT and including a saturation detection unit using a virtual ground according to the invention.

A more detailed embodiment of the Doherty power amplifier shown in FIG. 7A is shown in FIG. 7B. The Doherty power amplifier 700' of FIG. 7B also comprises an input splitter 708 adapted to receive a single-ended RF input signal RFIN and further adapted to split the single-ended input signal into a first and second RF single-ended input signal RF1, RF2 which have opposite phases to each other.

The Doherty power amplifier in FIG. 7B also comprises an output signal combiner 705 which converts amplified differential output signals PO11, PO12, CO11, CO12 from the PKA and the CRA into a single amplified single-ended output signal RFOUT. Furthermore, a first input signal converter 706 converts the first single-ended input signal RF1 into the differential signals CI11, CI12 having opposite phases to each other. A second input signal converter 704 converts the second single-ended RF input signal RF2 into the differential input signals PI11, PI12 for the CRA. The output inverter 707 is a push-pull output inverter 707 for combining the differential signals which are output by the PKA and CRA. The output inverter 707 is a push-pull output inverter for adjusting the phases of the amplified signals CO11, CO12 such that they can be combined in-phase with the amplified signals PO11, PO12 before they are combined/converted into the single-ended output signal RFOUT by the output signal combiner 705.

The differential (push-pull) Doherty power amplifier in FIG. 7B which inputs a single-ended RF input signal and outputs a single-ended amplified output signal RFOUT can be used in any of the power amplifier circuits in FIG. 1-5 or FIGS. 10-15.

Figure 7C:
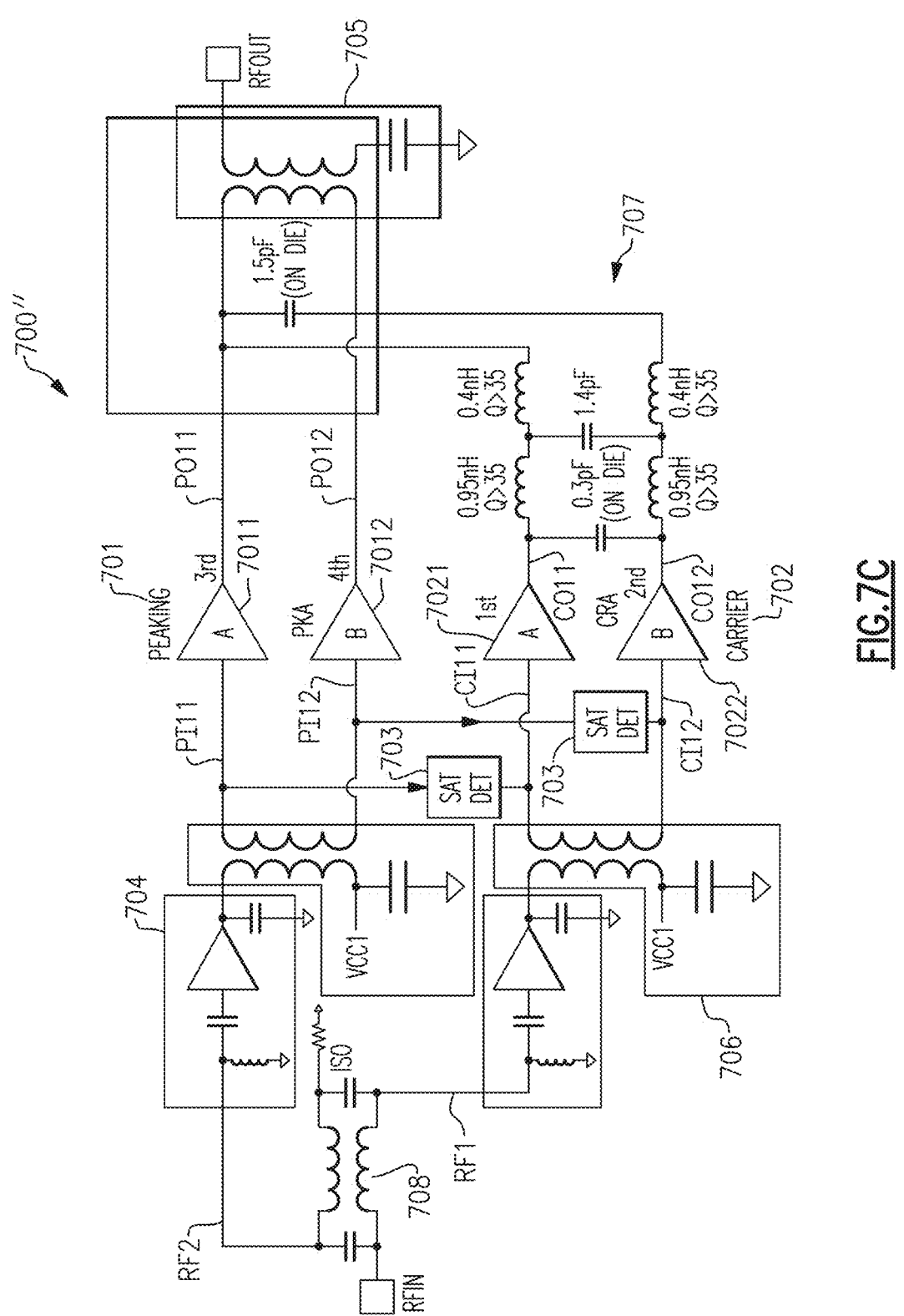
FIG. 7C illustrates an example of a concrete circuit diagram of a Doherty power amplifier with separate saturation detection units for the differential signals for explaining the principle of saturation detection in a differential Doherty power amplifier.

The block diagram in FIG. 7C shows one embodiment for the blocks 701-708 in FIG. 7B. It also shows where how the saturation detection unit 703 of FIG. 7B is connected to the CRA signals and the PKA signals.

In FIG. 7C, the input splitter 708 is realized by a transformer having a primary and a secondary winding. The input signal converters 704, 706 are realized by an amplification unit followed by a respective transformer. The output inverter 707 is realized by a T-circuit consisting of coils and a resistor. The output signal combiner 705 is realized, similarly as in FIG. 6C, by a transformer having a primary winding and a secondary winding where the secondary winding is connected to ground through a capacitor. It should be noted that in FIG. 7C the amplifiers in the first and second input signal converters 704 and 706 are not necessary for the conversion of the respective single-ended RF input signals RF1, RF2 to the differential signals PI11, PI12, CI11, CI12 which are amplified in the PKK and the CRA.

Figure 7D:
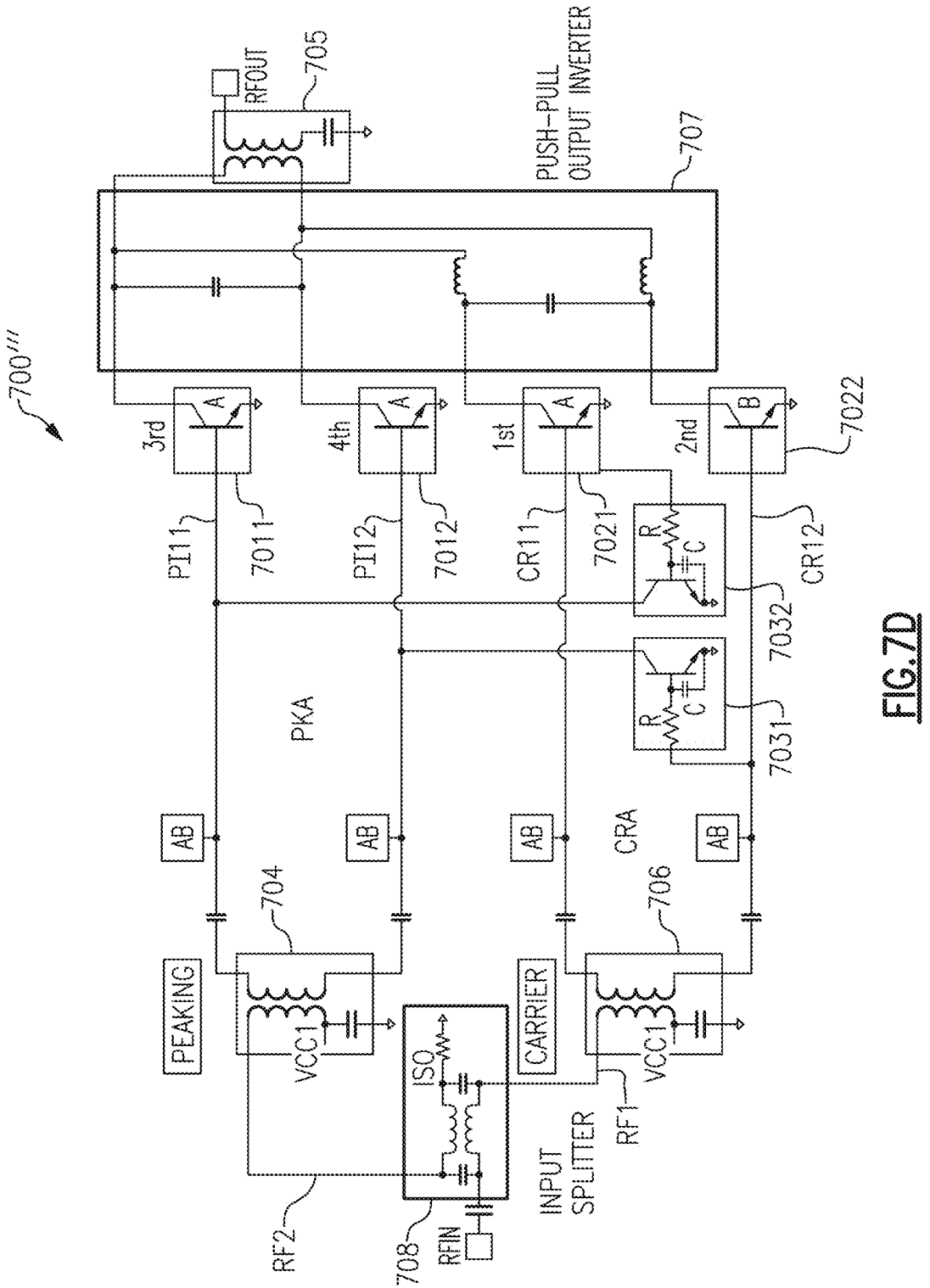
FIG. 7D illustrates a concrete circuit diagram of the Doherty power amplifier of FIG. 7C with saturation detection units realized by bipolar transistors and RC circuits.
Figure 7E:
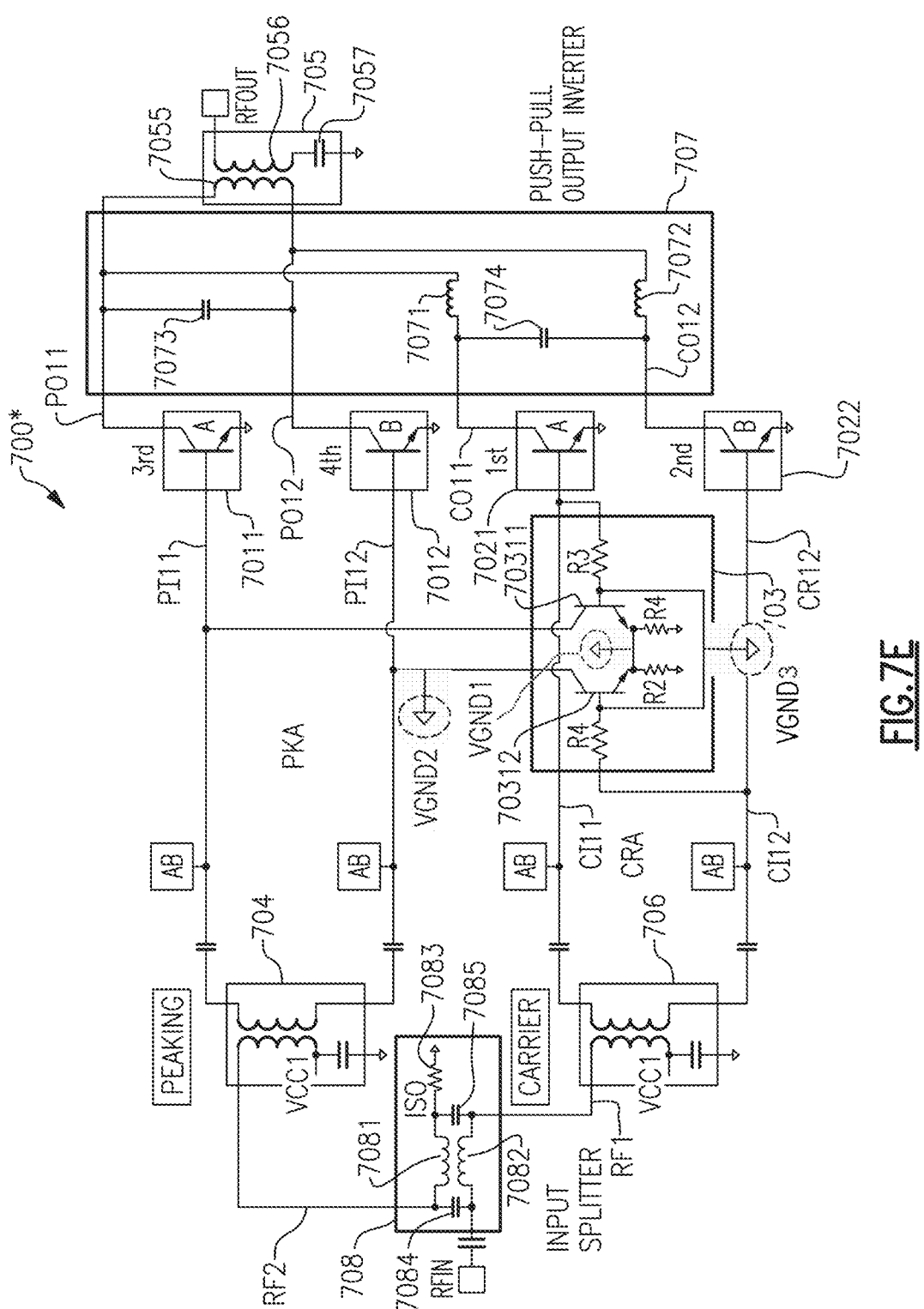
FIG. 7E illustrates a concrete circuit diagram of the Doherty power amplifier of FIG. 7B with saturation detection units realized by bipolar transistors and using virtual grounds according to the invention.

As will also be understood with further details and a more concrete embodiment in FIG. 7E, the saturation detection unit 703 receives input from the PKA and the CRA to essentially detect gain saturation of the differential carrier amplification stage CRA and to drive the differential peaking amplification stage PKA based on the detected gain saturation of the differential carrier amplification stage CRA. The saturation detection unit 703 is, for carrying out this functionality, connected to the differential input signals PI11, PI12 and CI11, CI12 of the PKA and the CRA. A more concrete embodiment of the saturation detection unit connected in this manner is shown in FIG. 7E and will be discussed below.

As also shown in FIG. 7C, the Doherty power amplifier 700″ includes in the differential carrier amplification stage CRA a first and second amplification unit 7021, 7022. The amplification units 7021, 7022 are adapted to amplify the differential signals CI11, CI12 output by the input signal converter 706. Likewise, the differential peaking amplification stage 701 comprises a third and a fourth amplification unit 7011, 7012 provided for amplifying the differential signals PI11, PI12 output by the input signal converter 704.

FIG. 7D shows, similarly as the Doherty power amplifier operating on single-ended signals in FIG. 5, a realization of the saturation detector with RC circuits and their limitations to capacitors and limited bandwidth. As shown in FIG. 7D, for a Doherty amplifier 700′″ operating on differential signals, saturation detection with RC circuits, similarly as in FIG. 5 but applied to differential signals, would be to provide two differential detection units 7031, 7032 each realized, similarly as in FIG. 2A and in FIG. 5, with RC circuits. Whilst the RC circuits connected to the base of the respective bipolar detection transistor can cancel RF on the differential signals, it has severe limitations regarding bandwidth and RF corruption.

In FIG. 7D, the Doherty power amplifier employs the saturation detector 113 of FIG. 5 twice and separately for each of the differential input signals CI11, CI12 and PI11, PI12. That is, for each of the differential signals PI11, PI12, the saturation detection units 7031, 7032 detect gain saturation of the differential carrier amplification stage CRA and the saturation detection units 7031, 7032 will drive the differential peaking amplification stage CRA based on the detected gain saturation of the differential carrier amplification stage. Therefore, also for a Doherty amplifier 700″″ operating on differential signals in the CRA and the PKA, respectively, RF cancellation is possible when using the saturation detector 23, 113 of FIG. 2A and FIG. 5 including RC networks twice. This, however, causes the above described the limitations regarding bandwidth and implementation of capacitors on a die.

FIG. 7E shows a Doherty amplifier 700*\* according to the invention which, similarly as the differential power amplifier 600″ in FIG. 6C, employs a saturation detection unit 703 which does not use a RC circuit for RF cancellation. The saturation detection unit 703 operates on differential signals and is connected to the respective inputs of the first to fourth amplification units 7021, 7022, 7011, 7012. The Doherty amplifier 700*\* in FIG. 7E also comprises the other circuits (input splitter, input signal converters, push-pull output inverter, and output signal combiner) 708, 704, 706, 707 and 705 already partially described above with reference to FIG. 7C and FIG. 7D.

The output signal combiner 705 comprises a transformer having a primary winding 7055 having a first and second terminal and a secondary winding 7076 having a first and second terminal. The output inverter 705 further comprises a first coupling capacitor 7073 connected between the collectors of gain transistors of the third and fourth amplification units 7011, 7012 of the peaking amplification stage PKA, and a second coupling capacitor 7074 connected between the collectors of gain transistors of the first and second amplification units 7021, 7022 of the carrier amplification stage CRA. The first terminal of the primary winding 7055 receives a third amplified differential signal PO11 from the third amplification unit 7011 of the peaking amplification stage PKA and a first amplified differential signal CO11 from the first amplification unit 7021 of the carrier amplification stage CRA through a first coupling resistor 7071 of the output inverter 707. The second terminal of the primary winding 7055 receives a fourth amplified differential signal PO12 from the fourth amplification unit 7012 of the peaking amplification stage PKA and a second amplified differential signal CO12 from the second amplification unit 7022 of the carrier amplification stage CRA through a second coupling resistor 7021 of the output inverter 707. The first terminal of the secondary winding 7056 is adapted to output the amplified output single-ended signal RFOUT and the second terminal of the secondary winding 7056 is connected to ground via a coupling capacitor 7057.

The input splitter 708 comprises a transformer having a primary winding 708 land a secondary winding 7082, a first terminal of the primary winding 7081 receives the single-ended RF input signal RFIN, a second terminal of the primary winding 7081 output the first single-ended RF input signal, a first terminal of the secondary winding 7082 outputs the single-ended second RF input signal RFOUT and a second terminal of the secondary winding 7082 is connected to ground via a resistor 7083. The first terminals of the primary and second windings 7081, 7082 are connected via a first capacitor 7084, and the second terminals of the primary and second windings 7081, 7082 are connected via a second capacitor 7082. The first single-ended RF input signal RF1 fed to the first input signal converter 706 is provided by the second terminal of the primary winding 7081 and the second single-ended RF input signal RF2 fed to the second input signal converter 704 is provided by the first terminal of the secondary winding 7082. The first and second windings 7081, 7082 are connected in such a manner that the first and second RF input signals are in anti-phase to each other.

The first and second signal converters 706, 704 have essentially the same construction as the signal converter 604 in FIG. 6C. They respectively receive the first and second RF single-ended input signal RF1, RF2 split by the input splitter 708 and output the respective differential signals CI11, CI12 and PI11, PI12 by using a primary coil the first terminal of which receives the respective input signal RF1, RF2 and the second terminal of which is connected to ground through a respective capacitor, and s secondary coil the two terminals of which output respectively the pairs of differential signals PI11, PI12 and CI11, CI12 of the PKA and the CRA. As cam be seen from comparing FIG. 6C with FIG. 7E, the Doherty power amplifier 700* essentially employs, regarding the amplification, a differential amplification stage of FIG. 6C respectively as a differential carrier amplification stage 702 and a differential peaking amplification stage 701.

Furthermore, similarly to FIG. 6C, the Doherty amplifier 700* operating on differential signals in FIG. 7E uses bipolar transistors (NPN transistors) in the first to fourth amplification units 7021, 7022, 7011, 7012 and inside the saturation detection unit 703. However, this is not limited to NPN bipolar transistors and also PNP bipolar transistors can be used. Furthermore, also transistor of other constructions like MOSFETs etc. may be used.

Also similarly to FIG. 6C (and the push-pull differential power amplifier 600″ shown in FIG. 6C), the saturation detection unit 703 for the differential Doherty amplifier 700* in FIG. 7B comprises a first bipolar detection transistor 70311 having a base thereof connected (through a resistor R3) to the base of the gain transistor of the first amplification unit 7021. The emitter of the first bipolar detection transistor 70311 is connected to ground through the first resistor R1 and is thermally coupled to the gain transistor of the first amplification unit 7021 of the carrier amplification stage CRA.

A second bipolar detection transistor 70312 of the saturation detection unit 703 has its base connected (through the resistor R4) to the base of the gain transistor of the second amplification unit 7022 of the carrier amplification stage CRA. The emitter of the second bipolar detection transistor 70312 is connected to ground via the second resistor R2. Furthermore, the second bipolar detection transistor 70312 is thermally coupled to the gain transistor of the second amplification unit 7022. For the thermal couplings of the first and second detection transistors 70311, 70312, the techniques described above for the amplifiers in FIG. 2A, FIG. 3, and FIG. 4 may be used.

The saturation detection transistors 70311, 70312 detect saturation of the amplification units 7021, 7022 of the carrier amplification stage CRA essentially simultaneously, the first detection transistor 70311 for the first amplification unit 7021 and the second detection transistor 70312 for the second amplification unit 7022, and then drive the respective amplification units 7011, 7012 of the peaking amplification stage PKA when a respective saturation is detected, the first detection transistor 70311 driving the third amplification unit 7011 (by having its collector connected to the base of the gain transistor of the third amplification unit 7011) and the second detection transistor 70312 driving the fourth amplification unit 7012 (by having its collector connected to the base of the gain transistor of the fourth amplification unit 7011).

According to one embodiment, regarding the driving, the saturation detection unit is operable to turn on the peaking amplification stage in response to the saturation detection unit detecting that the carrier amplification stage is saturated.

According to another embodiment, regarding the driving, the saturation detection unit is operable to adjust a bias of the peaking amplification stage.

Another embodiment is that the saturation detection unit is operable to adjust a voltage level of a power supply voltage of the Doherty power amplifier.

The collectors of the first and second bipolar detection transistors 70311, 70312 are thus connected respectively to the base of the gain transistors of the third and fourth amplification units 7011, 7012 of the peaking amplification stage PKA. As also shown in FIG. 7E, the base of the first and second bipolar detection transistors 70311, 70312 are connected together which establishes, similarly as in FIG. 6C, a third virtual ground VGND3 at the bases. The emitters of the first and second detection bipolar transistors 70311, 70312 are also connected together (with resistors R2, R4 connected to ground) and the connected emitters essentially establish, similarly as in FIG. 6C, a first virtual ground VGND1 at the emitters. Furthermore, also the collectors of the first and second detection transistors 70311, 70312 are connected together, through the secondary winding of the second input signal converter 704, which also establishes, similarly as in FIG. 6C, a second virtual ground VGND2, at the collectors. Thus, the saturation detection unit 703 establishes a virtual ground (first virtual ground, second virtual ground, and third virtual ground) for RF cancellation on the differential signals Pill, PI12, CI11, CI12. Having configured the saturation detection unit 703 with a virtual ground (virtual grounds) as shown in FIG. 7E, the resistors can be smaller and the capacitors (of FIG. 7D) can be removed which causes an increase in bandwidth. The virtual grounds also provide sufficient RF insulation. This also prevents the bases from being corrupted/rectified (like a free bypass capacitor). Thus, the connection of the bases of the A-side and B-side saturation detection transistors 70311, 70312 puts a virtual ground at the base and the connection of the emitters of the A-side and the B-site saturation detection transistors still allows that RE goes to the respective A-side and B-side grounds.

Experimental Results of the Doherty Amplifier Using Virtual Grounds

FIG. 8 shows experimental results of a simulation of the Doherty power amplifier 700* of FIG. 7E realized with the concrete circuit elements also shown in FIG. 8. The bandwidth improvement or more than two times the original bandwidth (from "Original Sat detect (220 MHz)" to "Updated Sat detect (500 MHz)") is clearly indicated. Hence, it can clearly be seen from FIG. 8 that due to the usage of virtual grounds instead of RC networks, a significant increase in the saturation detection bandwidth can be achieved.

The improvements of the saturation detection unit 703 using virtual grounds are also demonstrated in FIGS. 9A-9D where the Doherty power amplifier 700\* of FIG. 7E is compared with one that uses no virtual grounds. From the experimental results in the diagrams a) to d) in FIG. 9, the improvement in RF corruption in the Doherty power amplifier of FIG. 7E is indicated. The two diagrams arranged above each other at FIG. 9a) show the baseline. The diagrams at FIG. 9b) show the results for "no emitter virtual ground". The diagrams at FIG. 9c) show the results for "no base virtual ground". The diagrams at FIG. 9d) show the results for "no base/emitter virtual ground".

A power amplifier and in particular the Doherty amplifier operating on differential signals and using virtual grounds at the same time, having the improvements of bandwidth and manufacturability, can be used in any of the devices and circuits in FIGS. 1-5 described above and FIGS. 10-16 described below.

Mobile Device Using a Power Amplifier

Figure 10:
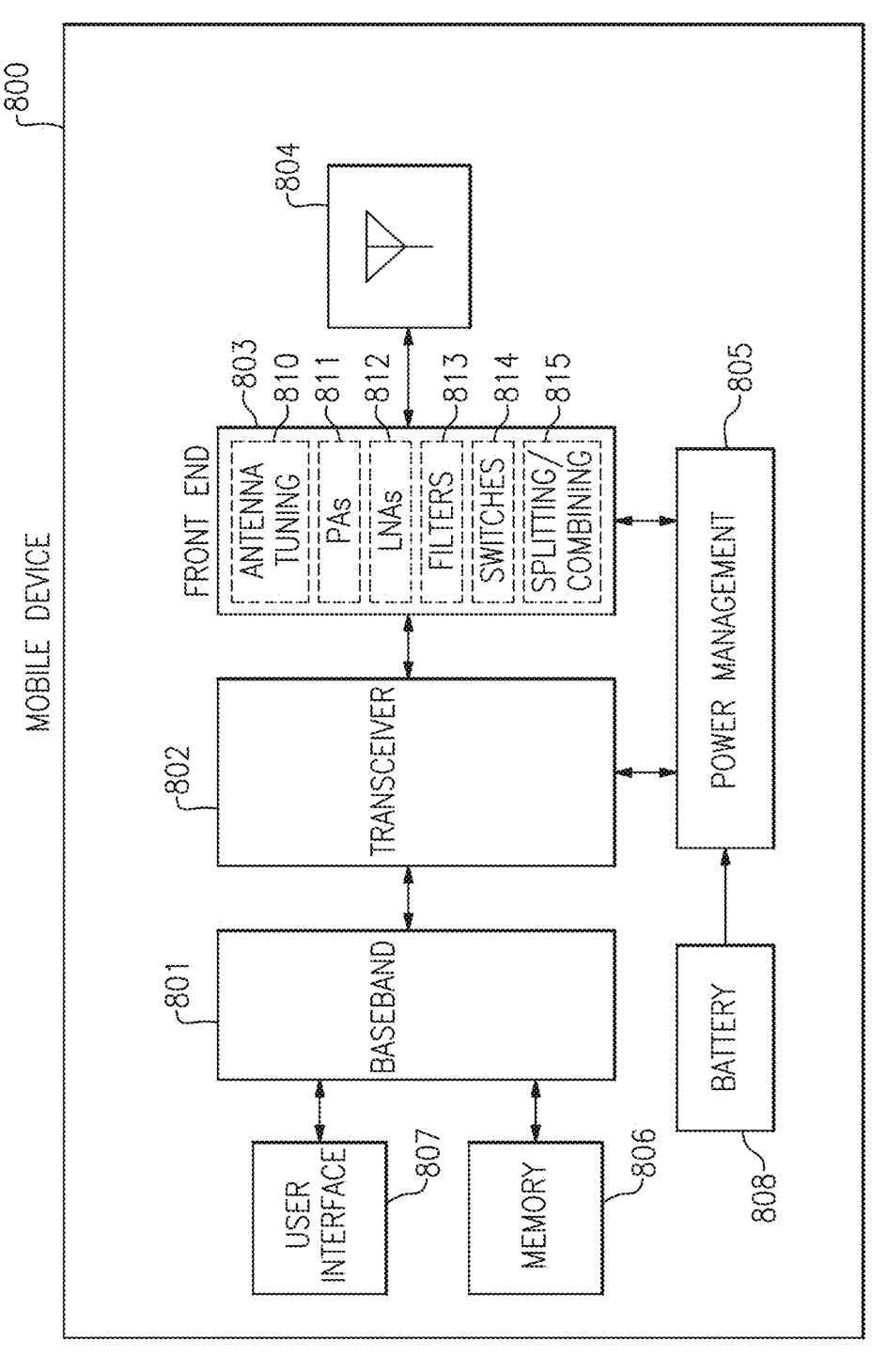
FIG. 10 is a schematic diagram of one embodiment of a mobile device.

FIG. 10 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 10 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes antenna tuning circuitry 810, power amplifiers (PAS) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

At least one of the power amplifiers 811 is implemented with saturation detection in accordance with the teachings herein. Although the mobile device 800 illustrates one embodiment of a communication system that can be implemented with a power amplifier system with saturation detection, the teachings herein are applicable to a wide range of systems. Accordingly, other implementations are possible.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band arc aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 10, the baseband system 801 is coupled to the memory 806 to facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 10, the power management system 805 receives a battery voltage from the battery 808. The battery 808 can be any suitable battery for use in the mobile device 800, including, for example, a lithium-ion battery.

Figure 11:
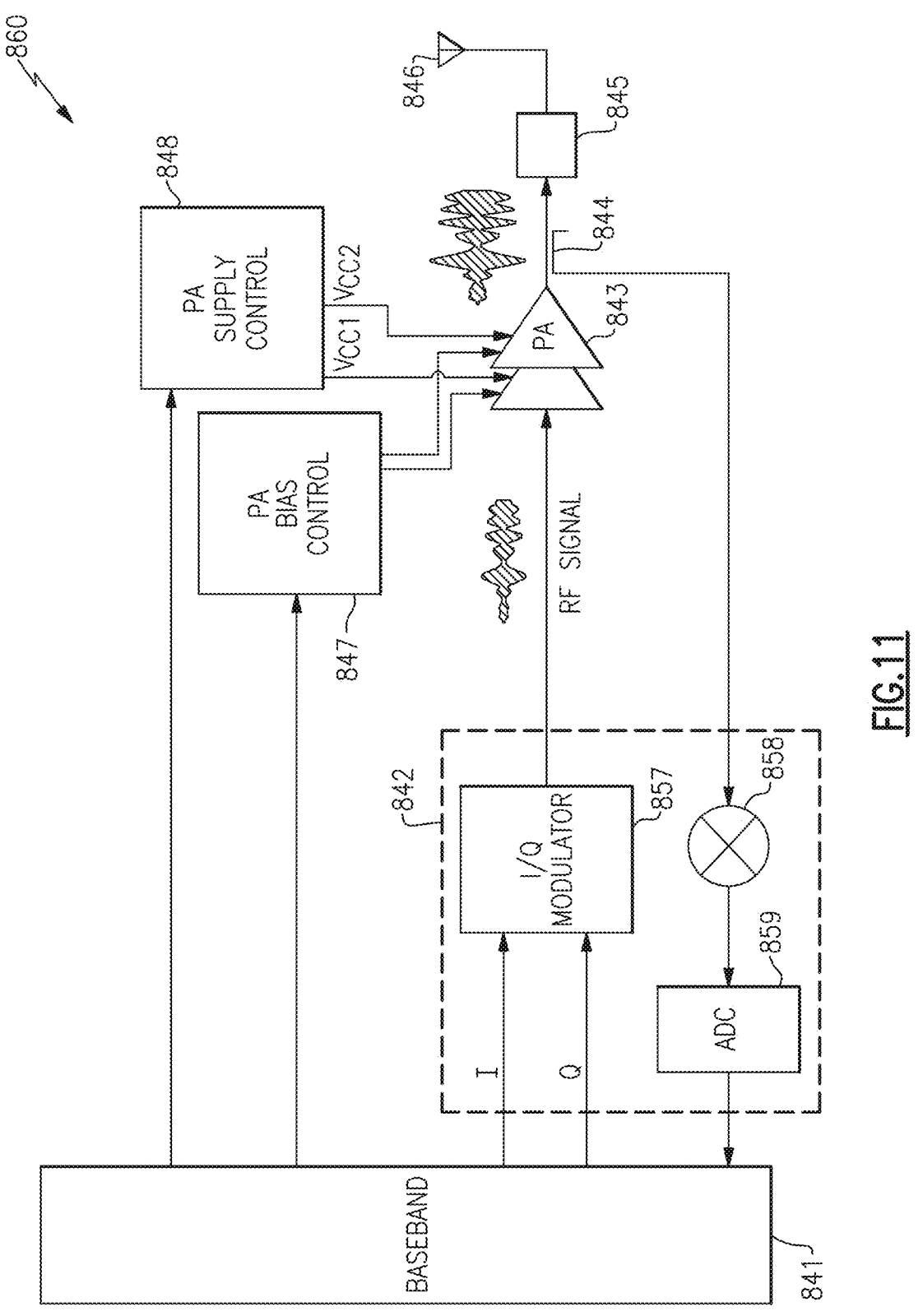
FIG. 11 is a schematic diagram of a power amplifier system according to another embodiment.

FIG. 11 is schematic diagram of a power amplifier system 860 according to another embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 821 can be included in the power amplifier system 860.

The I/Q modulator 857 can be configured to receive the I and Q signals from the baseband processor 821 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845. The power amplifier 843 can be implemented in accordance with any of the saturation detection schemes herein. In particular, The power amplifier 843 may be any here described power amplifier (also a Doherty-type differential or push-pull type power amplifier) including a saturation detection unit using virtual ground(s) described in the embodiments of the invention.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPL)). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 11, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

Figure 12A:
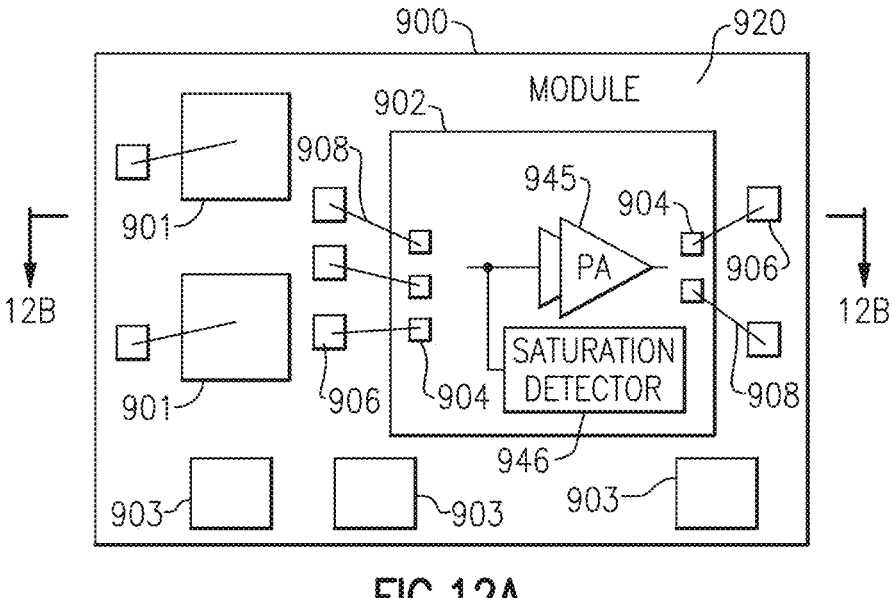
FIG. 12A is a schematic diagram of one embodiment of a packaged module.
Figure 12B:
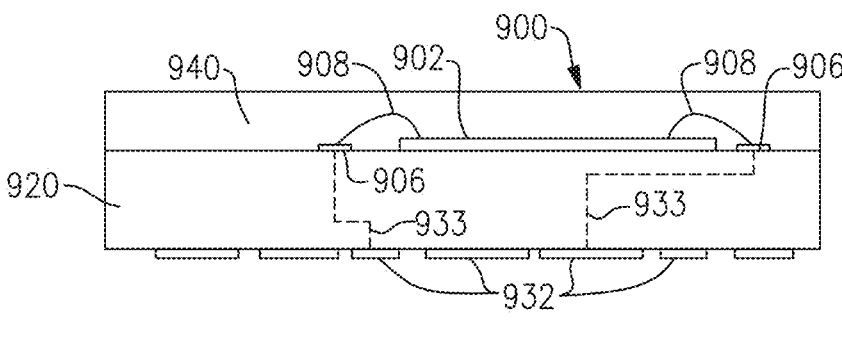
FIG. 12B is a schematic diagram of a cross-section of the packaged module of FIG. 12A taken along the lines 12B-12B.

FIG. 12A is a schematic diagram of one embodiment of a packaged module 900. FIG. 12B is a schematic diagram of a cross-section of the packaged module 900 of FIG. 12A taken along the lines 12B-12B.

The packaged module 900 includes radio frequency components 901, a semiconductor die 902, surface mount devices 903, wirebonds 908, a package substrate 920, and an encapsulation structure 940. The package substrate 920 includes pads 906 formed from conductors disposed therein.

Additionally, the semiconductor die 902 includes pins or pads 904, and the wirebonds 908 have been used to connect the pads 904 of the die 902 to the pads 906 of the package substrate 920.

The semiconductor die 902 includes a power amplifier 945 and a saturation detector 946, which can be implemented in accordance with any of the embodiments herein.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 12B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 12B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Transmit System Including Envelope Tracker

Figure 13A:
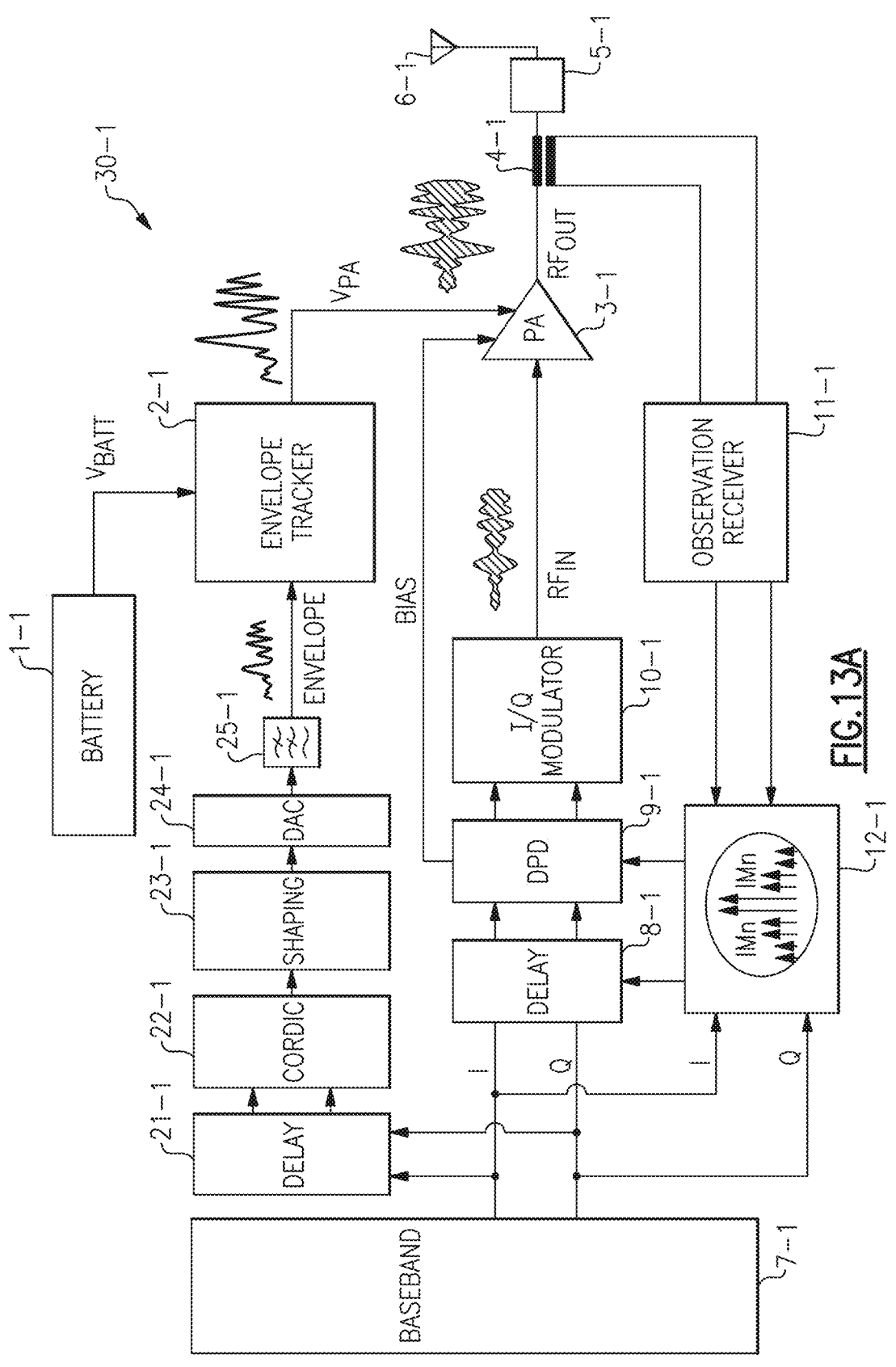
FIG. 13A is a schematic diagram of one embodiment of a transmit system for transmitting radio frequency (RF) signals from a mobile device using envelope tracking.

FIG. 13A illustrates a transmit system for transmitting RF signals from a mobile device. The transmit system 30-1 includes a battery 1-1, an envelope tracker 2-1, a power amplifier 3-1, a directional coupler 4-1, a duplexing and switching circuit 5-1, an antenna 6-1, a baseband processor 7-1, a signal delay circuit 8-1, a digital pre-distortion (DPD) circuit 9-1, an I/Q modulator 10-1, an observation receiver 11-1, an intermodulation detection circuit 12-1, an envelope delay circuit 21-1, a coordinate rotation digital computation (CORDIC) circuit 22-1, a shaping circuit 23-1, a digital-to-analog converter 24-1, and a reconstruction filter 25-1. The power amplifier 3-1 may be any here described power amplifier (also a Doherty-type differential or push-pull type power amplifier) including a saturation detection unit using virtual ground(s) as described in the embodiments of the invention.

The transmit system 30-1 of FIG. 13A illustrates one example of an RF communication system that can include power amplifier(s) implemented in accordance with one or more features of the present disclosure. However, the teachings herein are applicable to RF communication systems implemented in a wide variety of ways.

The baseband processor 7-1 operates to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals are provided to the I/Q modulator 10-1 in a digital format. The baseband processor 7-1 can be any suitable processor configured to process a baseband signal. For instance, the baseband processor 7-1 can include a digital signal processor, a microprocessor, a programmable core, or any combination thereof.

The signal delay circuit 8-1 provides adjustable delay to the I and Q signals to aid in controlling relative alignment between the envelope signal and the RF signal $RF_{IN}$. The amount of delay provided by the signal delay circuit 8-1 is controlled based on amount of intermodulation detected by the intermodulation detection circuit 12-1.

The DPD circuit 9-1 operates to provide digital shaping to the delayed I and Q signals from the signal delay circuit 8-1 to generate digitally pre-distorted I and Q signals. In the illustrated embodiment, the DPD provided by the DPD circuit 9-1 is controlled based on amount of intermodulation detected by the intermodulation detection circuit 12-1. The DPD circuit 9-1 serves to reduce a distortion of the power amplifier 3-1 and/or to increase the efficiency of the power amplifier 3-1.

The I/Q modulator 10-1 receives the digitally pre-distorted I and Q signals, which are processed to generate an RF signal $RF_{IN}$. For example, the I/Q modulator 10-1 can include DACs configured to convert the digitally pre-distorted I and Q signals into an analog format, mixers for upconverting the analog I and Q signals to radio frequency, and a signal combiner for combining the upconverted I and Q signals into an RF signal suitable for amplification by the power amplifier 3-1. In certain implementations, the I/Q modulator 10 can include one or more filters configured to filter frequency content of signals processed therein.

The envelope delay circuit 21-1 delays the I and Q signals from the baseband processor 7-1. Additionally, the CORDIC circuit 22-1 processes the delayed I and Q signals to generate a digital envelope signal representing an envelope of the RF signal $RF_{IN}$. Although FIG. 13A illustrates an implementation using the CORDIC circuit 22-1, an envelope signal can be obtained in other ways.

The shaping circuit 23-1 operates to shape the digital envelope signal to enhance the performance of the transmit system 30. In certain implementations, the shaping circuit 23-1 includes a shaping table that maps each level of the digital envelope signal to a corresponding shaped envelope signal level. Envelope shaping can aid in controlling linearity, distortion, and/or efficiency of the power amplifier 3.

In the illustrated embodiment, the shaped envelope signal is a digital signal that is converted by the DAC 24-1 to an analog envelope signal. Additionally, the analog envelope signal is filtered by the reconstruction filter 25-1 to generate an envelope signal suitable for use by the envelope tracker 2-1. In certain implementations, the reconstruction filter 25-1 includes a low pass filter.

With continuing reference to FIG. 13A, the envelope tracker 2-1 receives the envelope signal from the reconstruction filter 25-1 and a battery voltage $V_{BATT}$ from the battery 1-1, and uses the envelope signal to generate a power amplifier supply voltage $V_{PA}$ for the power amplifier 3-1 that changes in relation to the envelope of the RF signal $RF_{IN}$.

The power amplifier 3-1 receives the RF signal $RF_{IN}$ from the I/Q modulator 10-1, and provides an amplified RF signal $RF_{OUT}$ to the antenna 6-1 through the duplexing and switching circuit 5-1, in this example.

The directional coupler 4-1 is positioned between the output of the power amplifier 3-1 and the input of the duplexing and switching circuit 5-1, thereby allowing a measurement of output power of the power amplifier 3-1 that does not include insertion loss of the duplexing and switching circuit 5-1. The sensed output signal from the directional coupler 4 is provided to the observation receiver 11-1, which can include mixers for down converting I and Q signal components of the sensed output signal, and DACs for generating I and Q observation signals from the down converted signals.

The intermodulation detection circuit 12-1 determines an intermodulation product between the I and Q observation signals and the I and Q signals from the baseband processor 7. Additionally, the intermodulation detection circuit 12-1 controls the DPD provided by the DPD circuit 9-1 and/or a delay of the signal delay circuit 8-1 to control relative alignment between the envelope signal and the RF signal $RF_{IN}$.

By including a feedback path from the output of the power amplifier 3-1 and baseband, the I and Q signals can be dynamically adjusted to optimize the operation of the transmit system 30-1. For example, configuring the transmit system 30 in this manner can aid in providing power control, compensating for transmitter impairments, and/or in performing DPD.

Although illustrated as a single stage, the power amplifier 3-1 can include one or more stages as will be explained below with more details. Furthermore, RF communication systems such as mobile devices can include multiple power amplifiers. In such implementations, separate envelope trackers can be provided for different power amplifiers and/or one or more shared envelope trackers can be used.

The differential power amplifiers described with reference to the embodiments in FIGS. 5-9 can be used in a transmit system including envelope tracking as described above.

Envelope Tracking Operating with Power Amplifiers

Envelope tracking is a technique that can be used to increase power added efficiency (PAE) of a power amplifier by efficiently controlling a voltage level of a power amplifier supply voltage in relation to an envelope of the RF signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

In one example, an envelope tracker includes a DC-to-DC converter that operates in combination with an error amplifier to generate a power amplifier supply voltage based on an envelope signal. For example, the DC-to-DC converter and the error amplifier can be electrically connected in parallel with one another, and the DC-to-DC converter can track low frequency components of the envelope signal while the error amplifier can track high frequency components of the envelope signal. For example, the DC-to-DC converter's switching frequency can be reduced to be less than a maximum frequency component of the envelope signal, and the error amplifier can operate to smooth gaps in the converter's output to generate the power amplifier supply voltage. In certain implementations, the DC-to-DC converter and error amplifier are combined via a combiner.

In another example, an envelope tracker includes a multi-output boost switcher for generating regulated voltages of different voltage levels, a bank of switches for controlling selection of a suitable regulated voltage over time based on the envelope signal, and a filter for filtering the output of the switch bank to generate the power amplifier supply voltage.

Power amplifiers are also available with adaptive bias for envelope tracking applications. In certain embodiments, an envelope tracking system includes a power amplifier that amplifies an RF signal and that receives power from a power amplifier supply voltage, and an envelope tracker that generates the power amplifier supply voltage based on an envelope of the RF signal. Power amplifiers can be realized with bipolar transistors or field effect transistors (FETs). The power amplifier includes a field-effect transistor (FET) for amplifying the RF signal and a current mirror including an input that receives a reference current and an output connected to the power amplifier supply voltage. An internal voltage of the current minor is used to bias the gate of the FET to compensate the FET for changes in the power amplifier supply voltage arising from envelope tracking.

By implementing the power amplifier with adaptive bias, non-idealities of the FET are compensated. For example, such adaptive biasing aids in compensating for channel length modulation and/or drain induced barrier lowering that would otherwise give rise to high variation in RF gain versus power amplifier supply voltage.

In certain implementations, the FET is implemented as a short channel metal oxide semiconductor (MOS) transistor. Although short channel MOS transistors suffer from a number of transistor non-idealities, adaptive biasing provides compensation that enables the short channel MOS transistor to be used in the power amplifier without significantly degrading the power amplifier's performance. Since short channel MOS transistors can be fabricated in processes that are low cost and/or enable high degrees of integration, it is desirable to implement a power amplifier using a short channel MOS transistor in a number of applications.

In certain implementations, a buffer is further included for buffering the internal voltage of the current mirror to generate the gate bias voltage of the FET. Including the buffer can enhance the bandwidth and speed-up the transient response of the power amplifier's biasing, thereby improving amplitude and phase distortion.

The current minor can be implemented in a wide variety of ways. In certain implementations, the current mirror is implemented as a Wilson current minor. For example, the current minor can be implemented using n-type field-effect transistors (NFETs) arranged as a four transistor Wilson current mirror. For example, the drain-to-source voltage of a first NFET of a four transistor Wilson minor can increase as voltage of the output decreases, and is well-suited for increasing the power amplifier's gain as power amplifier supply voltage decreases.

The differential power amplifiers described with reference to the embodiments in FIGS. 5-9 can be used in such envelope tracking systems.

Applications of 2-Stage Power Amplifier Design with RF Feedback

Having described the principal operation of the power amplifier 800 and 7001 according to the embodiments of the invention, hereinafter, the application of the 2-stage power amplifiers in an envelope tracking system is described.

Figure 13B:
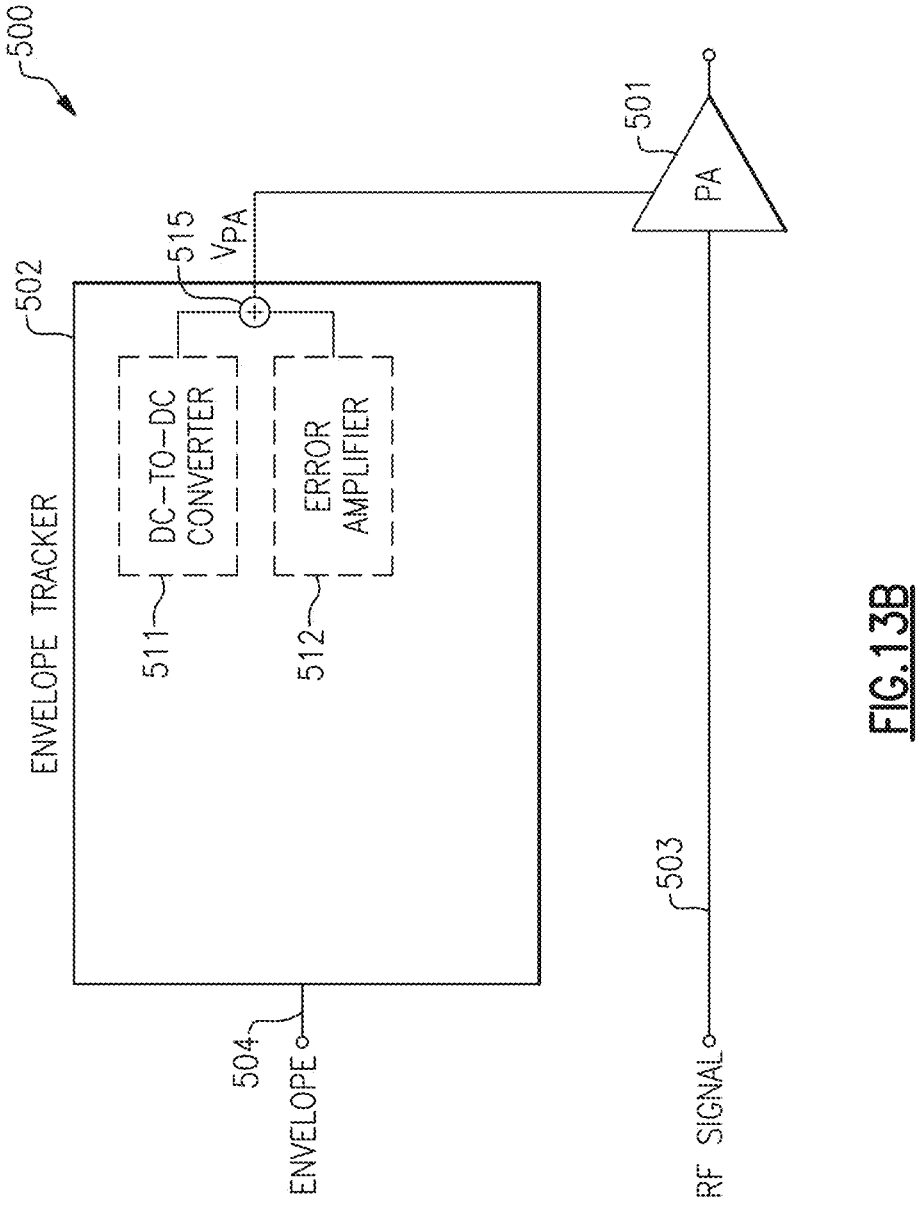
FIG. 13B is a schematic diagram of an envelope tracking system according to one embodiment.

FIG. 13B is a schematic diagram of an envelope tracking system 500 according to one embodiment. The envelope tracking system 500 includes a power amplifier 501 and an envelope tracker 502. The power amplifier 501 provides amplification to a radio frequency signal 503.

The envelope tracker 502 receives an envelope signal 504 corresponding to an envelope of the radio frequency signal 503. Additionally, the envelope tracker 502 generates a power amplifier supply voltage VPA, which supplies power to the power amplifier 501.

The illustrated envelope tracker 502 includes a DC-to-DC converter 511 and an error amplifier 512 that operate in combination with one another to generate the power amplifier supply voltage VPA based on the envelope signal 504. In the illustrated embodiment, an output of the DC-to-DC converter 511 and an output of the error amplifier 512 are combined using a combiner 515.

The envelope tracker 502 of FIG. 13B illustrates one example of analog envelope tracking, in which a switching regulator operate in parallel with one another to track an envelope of an RF signal.

Figure 13C:
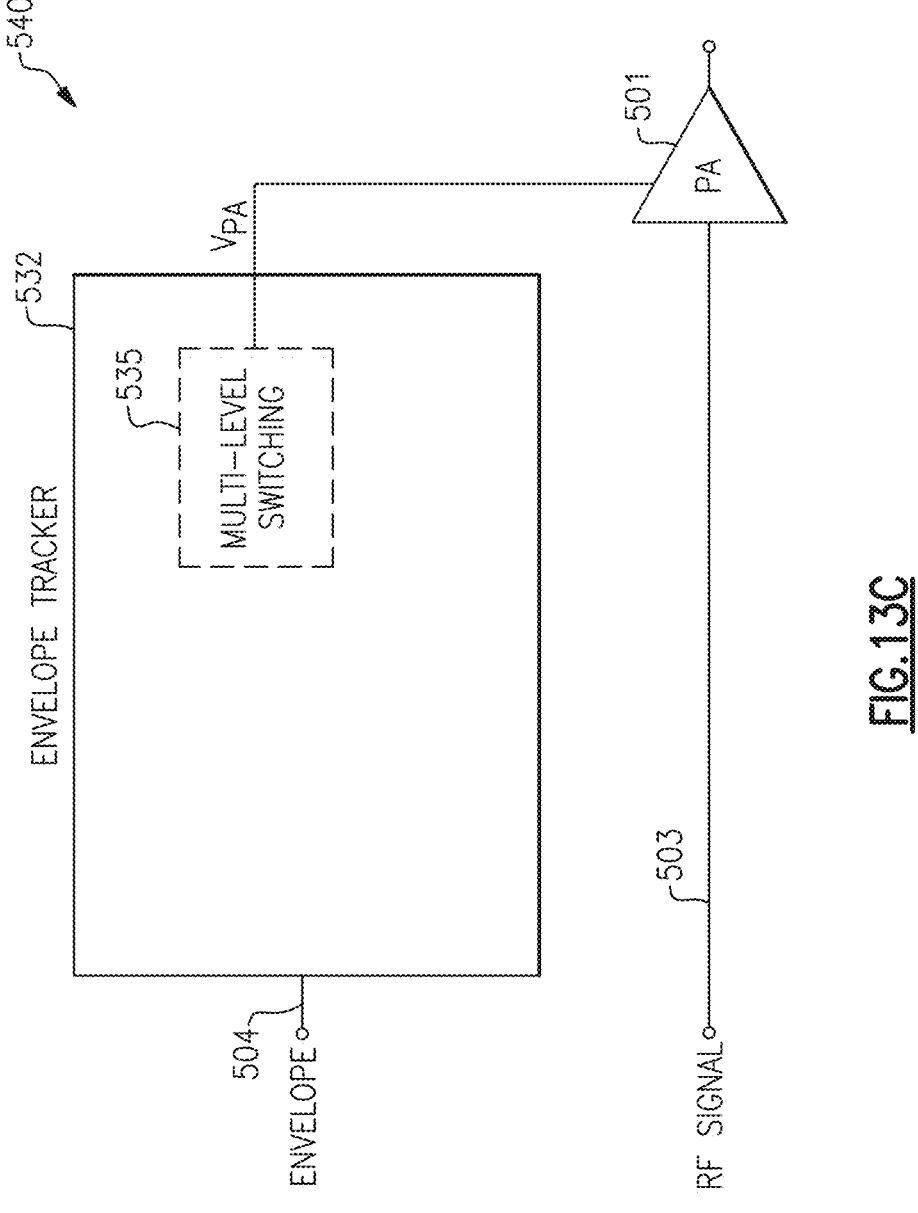
FIG. 13C is a schematic diagram of an envelope tracking system according to another embodiment.

FIG. 13C is a schematic diagram of an envelope tracking system 540 according to another embodiment. The envelope tracking system 540 includes a power amplifier 501 and an envelope tracker 532. The power amplifier 501 provides amplification to a radio frequency signal 503.

The envelope tracker 532 receives an envelope signal 504 corresponding to an envelope of the radio frequency signal 503. Additionally, the envelope tracker 532 generates a power amplifier supply voltage $V_{P4}$, which supplies power to the power amplifier 501.

The illustrated envelope tracker 532 includes a multi-level switching circuit 535. In certain implementations, the multi-level switching circuit includes a multi-output DC-to-DC converter for generating regulated voltages of different voltage levels, switches for controlling selection of a suitable regulated voltage over time based on the envelope signal, and a filter for filtering the output of the switches to generate the power amplifier supply voltage.

The envelope tracker 532 of FIG. 13C illustrates one example of MLS envelope tracking.

Figure 14:
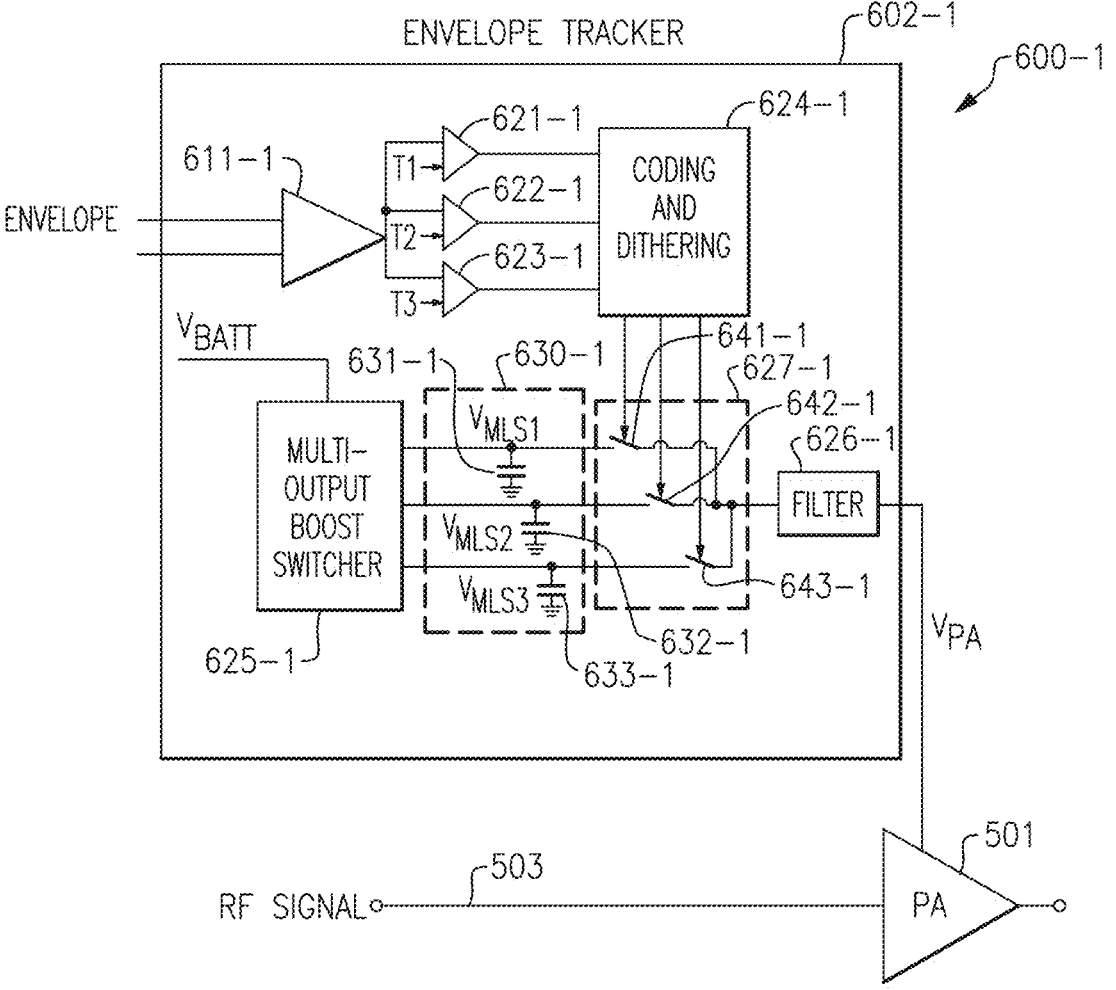
FIG. 14 is a schematic diagram of an envelope tracking system according to another embodiment.

FIG. 14 is a schematic diagram of an envelope tracking system 600-1 according to another embodiment. The envelope tracking system 600-1 includes a power amplifier 501 and an envelope tracker 602-1. The power amplifier 501 provides amplification to a radio frequency signal 503.

The envelope tracker 602-1 receives an envelope signal corresponding to an envelope of the radio frequency signal 503. In this example, the envelope signal is differential. Additionally, the envelope tracker 602-1 generates a power amplifier supply voltage $V_{P4}$, which supplies power to the power amplifier 501.

The illustrated envelope tracker 602-1 includes an envelope amplifier 611-1, a first comparator 621-1, a second comparator 622-1, a third comparator 623-1, a coding and dithering circuit 624-1, a multi-output boost switcher 625-1, a filter 626-1, a switch bank 627-1, and a capacitor bank 630-1. The capacitor bank 630-1 includes a first capacitor 631-1, a second capacitor 632-1, and a third capacitor 633-1. Additionally, the switch bank 627-1 includes a first switch 641-1, a second switch 642-1, and a third switch 643-1.

The envelope amplifier 611-1 amplifies the envelope signal to provide an amplified envelope signal to the first to third comparators 621-1-623-1. The first to third comparators 621-1-623-1 compare the amplified envelope signal to a first threshold T1, a second threshold T2, and a third threshold T3, respectively. The results of the comparisons are provided to the coding and dithering circuit 624-1, which processes the results to control selection of switches of the switch bank 627-1. The coding and dithering circuit 624-1 can activate the switches while using coding and/or dithering to reduce artifacts arising from opening and closing the switches.

Although an example with three comparators is shown, more or fewer comparators can be used. Furthermore, the coding and dithering circuit 624-1 can be omitted in favor of controlling the switch bank in other ways. In a first example, coding but not dithering is used. In a second example, dithering but not coding is used. In a third example, neither coding nor dithering is used.

The multi-output boost switcher 625-1 generates a first regulated voltage $V_{MLS1}$, a second regulated voltage $V_{MLS2}$, and a third regulated voltage $V_{MLS3}$ based on providing DC-to-DC conversion of a battery voltage $V_{BATT}$. Although an example with three regulated voltages is shown, the multi-output boost switcher 625-1 can generate more or fewer regulated voltages. In certain implementations, at least a portion of the regulated voltages are boosted relative to the battery voltage $V_{BATT}$. In some configurations, one or more of the regulated voltages is a buck voltage having a voltage lower than the battery voltage $V_{BATT}$.

The capacitor bank 630-1 aids in stabilizing the regulated voltages generated by the multi-output boost switcher 625-1. For example, the capacitors 631-1-633-1 operate as decoupling capacitors.

The filter 626-1 processes the output of the switch bank 627-1 to generate the power amplifier supply voltage $V_{P4}$. By controlling the selection of the switches 641-1-643-1 over time based on the envelope signal, the power amplifier supply voltage $V_{P4}$ is generated to track the envelope signal.

Figure 15A:
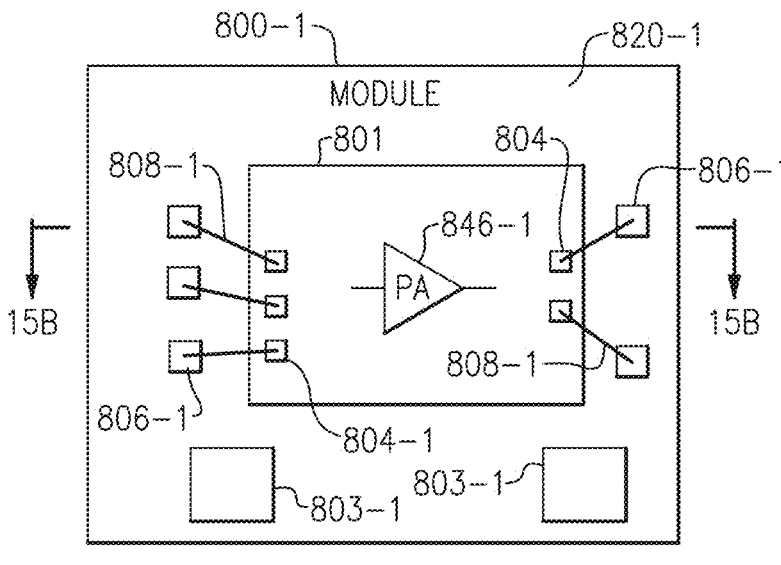
FIG. 15A is a schematic diagram of one embodiment of a packaged module.
Figure 15B:
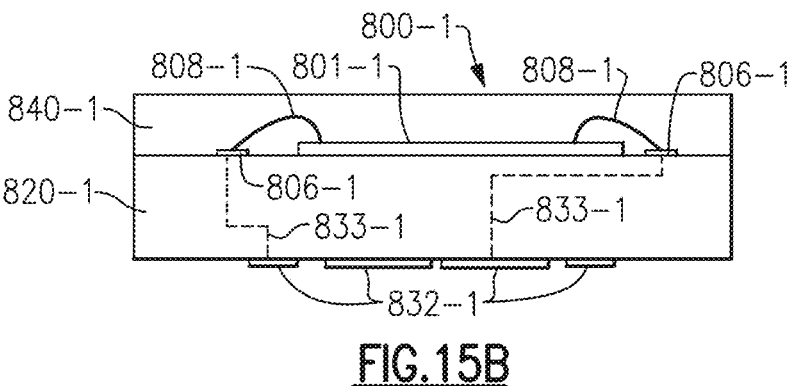
FIG. 15B is a schematic diagram of a cross-section of the packaged module of FIG. 15A taken along the lines 15A-15B.

FIG. 15A is a schematic diagram of one embodiment of a packaged module 800. FIG. 15B is a schematic diagram of a cross-section of the packaged module 800 of FIG. 15A taken along the lines 15A-15B.

The packaged module 800-1 includes an IC or die 801-1, surface mount components 803-1, wirebonds 808-1, a package substrate 820-1, and encapsulation structure 840-1. The package substrate 820-1 includes pads 806-1 formed from conductors disposed therein. Additionally, the die 801-1 includes pads 804-1, and the wirebonds 808-1 have been used to electrically connect the pads 804-1 of the die 801-1 to the pads 806-1 of the package substrate 801-1.

The die 801-1 includes a power amplifier 846-1, which can be implemented in accordance with any of the embodiments herein.

The packaging substrate 820-1 can be configured to receive a plurality of components such as the die 801-1 and the surface mount components 803-1, which can include, for example, surface mount capacitors and/or inductors.

As shown in FIG. 15B, the packaged module 800-1 is shown to include a plurality of contact pads 832-1 disposed on the side of the packaged module 800-1 opposite the side used to mount the die 801-1. Configuring the packaged module 800-1 in this manner can aid in connecting the packaged module 800-1 to a circuit board such as a phone board of a wireless device. The example contact pads 832-1 can be configured to provide RF signals, bias signals, power low voltage(s) and/or power high voltage(s) to the die 801-1 and/or the surface mount components 803-1. As shown in FIG. 15B, the electrically connections between the contact pads 832-1 and the die 801-1 can be facilitated by connections 833-1 through the package substrate 820-1. The connections 833-1 can represent electrical paths formed through the package substrate 820-1, such as connections associated with vias and conductors of a multilayer laminated package substrate.

In some embodiments, the packaged module 800-1 can also include one or more packaging structures to, for example, provide protection and/or facilitate handling of the packaged module 800-1. Such a packaging structure can include overmold or encapsulation structure 840-1 formed over the packaging substrate 820-1 and the components and die(s) disposed thereon.

It will be understood that although the packaged module 800-1 is described in the context of electrical connections based on wirebonds, one or more features of the present disclosure can also be implemented in other packaging configurations, including, for example, flip-chip configurations.

Figure 16:
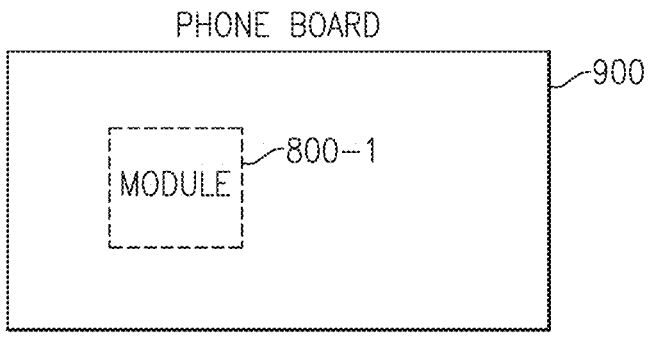
FIG. 16 is a schematic diagram of one embodiment of a phone board.

FIG. 16 is a schematic diagram of one embodiment of a phone board 900. The phone board 900 includes the module 800-1 shown in FIGS. 15A-15B attached thereto. Although not illustrated in FIG. 16 for clarity, the phone board 800-1 can include additional components and structures.

The differential power amplifiers described with reference to the embodiments in FIGS. 5-9 can be used in such applications of 2-stage power amplifier design with RF Feedback

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A differential power amplification stage comprising:
   a first amplification unit adapted to amplify a first differential signal and to output an amplified first differential signal;
   a second amplification unit adapted to amplify a second differential signal having opposite phase to the first differential signal and to output an amplified second differential signal; and
   a saturation detection unit adapted to detect gain saturation of the first and second amplification unit, to generate a saturation detection signal indicating the gain saturation of first and second amplification unit, and to provide a virtual ground for the first and second differential signals for radio frequency cancellation on the first and second differential signals.

2. The differential power amplifier stage of claim 1 further including:
   an input signal converter including an input configured to receive a single-ended radio frequency, radio frequency, input signal and to convert same into the first and second differential signal having opposite phase to each other; and
   an output signal combiner adapted to combine the first and second amplified differential signals into an amplified single-ended output signal.

3. The differential power amplifier stage of claim 1 wherein the first and second amplification units each include a bipolar gain transistor and the saturation detection unit includes:
   a first bipolar detection transistor having a base thereof connected to a base of the gain transistor of the first amplification unit, having an emitter thereof connected to ground via a first resistor, and being thermally coupled to the gain transistor of the first amplification unit;
   a second bipolar detection transistor having a base thereof connected to a base of the gain transistor of the second amplification unit, having an emitter thereof connected to ground via a second resistor, and being thermally coupled to the gain transistor of the second amplification unit.

4. The differential power amplifier stage of claim 3 wherein collectors of the first and second bipolar detection transistors are connected to a power supply voltage though a third resistor, the bases of the first and second bipolar detection transistors are connected together to establish a virtual ground at the bases, and the emitters of the first and second detection bipolar transistors are connected together to establish a virtual ground at the emitters.

5. The differential power amplifier stage of claim 4 wherein the connected collectors are configured to output the saturation detection signal indicating a gain saturation of the gain transistors of the first and second amplifier unit.

6. A Doherty power amplifier comprising:
a first differential amplification stage constituting a differential carrier amplification stage of the Doherty power amplifier;
a second differential amplification stage constituting a differential peaking amplification stage of the Doherty power amplifier; and
a saturation detection unit adapted to detect gain saturation of the differential carrier amplification stage, to drive the differential peaking amplification stage based on the detected gain saturation of the differential carrier amplification stage, and to provide a virtual ground for differential signals of the differential carrier amplification stage for radio frequency cancellation on the differential signals.

7. The Doherty power amplifier of claim 6 wherein the differential carrier amplification stage includes a first and second amplification unit adapted to amplify a first and a second differential signal having opposite phases and corresponding to a first single-ended radio frequency input signal, and the differential peaking amplification stage includes a third and fourth amplification unit adapted to amplify a third and a fourth differential signal having opposite phases and corresponding to a second radio frequency single-ended radio frequency input signal.

8. The Doherty power amplifier of claim 7 further including:
an input splitter adapted to receive the single-ended radio frequency input signal and to split the single-ended radio frequency input signal into the first and second radio frequency single-ended input signals having opposite phases; and
an output converter adapted to convert amplified differential output signals output from the first to fourth amplification units into an amplified output single-ended signal.

9. The Doherty power amplifier of claim 8 wherein the first to fourth amplification units each include a bipolar gain transistor and the saturation detection unit includes:
a first bipolar detection transistor having a base thereof connected to a base of the gain transistor of the first amplification unit of the carrier amplification stage, having an emitter thereof connected to ground via a first resistor, and being thermally coupled to the gain transistor of the first amplification unit of the carrier amplification stage; and
a second bipolar detection transistor having a base thereof connected to a base of the gain transistor of the second amplification unit of the carrier amplification stage, having an emitter thereof connected to ground via a second resistor, and being thermally coupled to the gain transistor of the second amplification unit.

10. The Doherty power amplifier of claim 9 wherein the collector of the first bipolar detection transistor is connected to the base of the gain transistor of the third amplification unit of the peaking amplification stage, and the collector of the second bipolar detection transistor is connected to the base of the gain transistor of the fourth amplification unit of the peaking amplification stage.

11. The Doherty power amplifier of claim 10 wherein the bases of the first and second bipolar detection transistors are connected together to establish a virtual ground at the bases, and the emitters of the first and second detection bipolar transistors are connected together to establish a virtual ground at the emitters.

12. The Doherty power amplifier of claim 6 wherein the saturation detection unit is operable to adjust a bias of the peaking amplification stage.

13. The Doherty power amplifier of claim 6 wherein the saturation detection unit is operable to adjust a voltage level of a power supply voltage of the Doherty power amplifier.

14. A front end system including the Doherty power amplifier of claim 6.

15. A mobile device comprising:
a transceiver configured to generate a single-ended radio frequency input signal; and
a front end system including a Doherty power amplifier configured to receive the single-ended radio frequency input signal at an input and configured to amplify the single-ended radio frequency input signal into an amplified single-ended radio frequency output signal;
the Doherty power amplifier including a first differential amplification stage constituting a differential carrier amplification stage of the Doherty power amplifier, a second differential amplification stage constituting a differential peaking amplification stage of the Doherty power amplifier, and a saturation detection unit adapted to detect gain saturation of the differential carrier amplification stage, to drive the differential peaking amplification stage based on the detected gain saturation of the differential carrier amplification stage, and to provide a virtual ground for differential signals of the differential carrier amplification stage for radio frequency cancellation on the differential signals.

16. The mobile device of claim 15 wherein the differential carrier amplification stage includes a first and second amplification unit adapted to amplify a first and a second differential signal having opposite phases and corresponding to a first radio frequency single-ended input signal, and the differential peaking amplification stage includes a third and fourth amplification unit adapted to amplify a third and a fourth differential signal having opposite phases and corresponding to a second single-ended radio frequency input signal.

17. The mobile device of claim 16 further including:
an input splitter adapted to receive the single-ended radio frequency input signal and to split the single-ended radio frequency input signal into the first and second single-ended radio frequency input signals having opposite phases; and
an output converter adapted to convert amplified differential output signals output from the first to fourth amplification units into an amplified output single-ended signal.

18. The mobile device of claim 17 wherein the first to fourth amplification units each include a bipolar gain transistor and the saturation detection unit includes:
a first bipolar detection transistor having a base thereof connected to a base of the gain transistor of the first amplification unit of the carrier amplification stage, having an emitter thereof connected to ground via a first resistor, and being thermally coupled to the gain transistor of the first amplification unit of the carrier amplification stage; and a second bipolar detection transistor having a base thereof connected to a base of the gain transistor of the second amplification unit of the carrier amplification stage, having an emitter thereof connected to ground via a second resistor, and being thermally coupled to the gain transistor of the second amplification unit.

19. The mobile device of claim 18 wherein the collector of the first bipolar detection transistor is connected to the base of the gain transistor of the third amplification unit of the peaking amplification stage, and the collector of the second bipolar detection transistor is connected to the base of the gain transistor of the fourth amplification unit of the peaking amplification stage.

20. The mobile device of claim 19 wherein the bases of the first and second bipolar detection transistors are connected together to establish a virtual ground at the bases, and the emitters of the first and second detection bipolar transistors are connected together to establish a virtual ground at the emitters.

* * * * *